US011417513B2

(12) United States Patent
Otsuji et al.

(10) Patent No.: US 11,417,513 B2
(45) Date of Patent: Aug. 16, 2022

(54) SUBSTRATE PROCESSING METHOD AND SUBSTRATE PROCESSING APPARATUS

(71) Applicant: SCREEN Holdings Co., Ltd., Kyoto (JP)

(72) Inventors: Masayuki Otsuji, Kyoto (JP); Hiroaki Takahashi, Kyoto (JP); Masahiko Kato, Kyoto (JP); Yu Yamaguchi, Kyoto (JP); Yuta Sasaki, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 16/898,499

(22) Filed: Jun. 11, 2020

(65) Prior Publication Data

US 2020/0411309 A1 Dec. 31, 2020

(30) Foreign Application Priority Data

Jun. 28, 2019 (JP) .............................. JP2019-120652
Jan. 9, 2020 (JP) .............................. JP2020-001888

(51) Int. Cl.
*B08B 7/00* (2006.01)
*B08B 3/08* (2006.01)
(Continued)

(52) U.S. Cl.
CPC .......... *H01L 21/02101* (2013.01); *B08B 3/08* (2013.01); *B08B 7/0014* (2013.01); *H01L 21/67034* (2013.01); *H01L 21/68764* (2013.01)

(58) Field of Classification Search
CPC ......... H01L 21/02101; H01L 21/68764; H01L 21/67034; H01L 21/02057;
(Continued)

(56) References Cited

U.S. PATENT DOCUMENTS

2007/0123052 A1* 5/2007 Kashkoush ............. G03F 7/423
438/725
2008/0078426 A1* 4/2008 Miya ................. H01L 21/67051
134/30
(Continued)

FOREIGN PATENT DOCUMENTS

JP          61083102 A    *  4/1986
JP     2012-243869 A       12/2012
(Continued)

OTHER PUBLICATIONS

Office Action dated Feb. 18, 2021 for corresponding Taiwanese Patent Application No. 109118921.
(Continued)

*Primary Examiner* — Alexander Markoff
(74) *Attorney, Agent, or Firm* — Ostrolenk Faber LLP

(57) ABSTRACT

To dry a substrate formed with a pattern on a front surface satisfactorily and with excellent drying performance, a substrate processing method comprises: a liquid film formation step of forming a liquid film of a processing liquid, in which cyclohexanone oxime is dissolved in a solvent, on a front surface of a substrate formed with a pattern by supplying the processing liquid to the front surface of the substrate; a solidified film formation step of forming a solidified film of the cyclohexanone oxime by solidifying the liquid film of the processing liquid; and a sublimation step of removing the solidified film from the front surface of the substrate by sublimating the solidified film.

15 Claims, 9 Drawing Sheets

(51) Int. Cl.
*H01L 21/02* (2006.01)
*H01L 21/687* (2006.01)
*H01L 21/67* (2006.01)

(58) Field of Classification Search
CPC ......... H01L 21/67051; H01L 21/67028; H01L 21/68742; H01L 21/02054; H01L 21/02052; B08B 3/08; B08B 7/0014; F26B 5/005; C09D 5/00; C09D 7/63
See application file for complete search history.

(56) References Cited

U.S. PATENT DOCUMENTS

| | | | | |
|---|---|---|---|---|
| 2016/0035561 | A1* | 2/2016 | Aibara | H01L 21/67028 134/4 |
| 2016/0336169 | A1* | 11/2016 | Fujiwara | B08B 3/02 |
| 2017/0345662 | A1* | 11/2017 | Sasaki | B24B 37/04 |
| 2019/0030576 | A1* | 1/2019 | Hanawa | B08B 3/10 |
| 2019/0063833 | A1* | 2/2019 | Okutani | H01L 21/67034 |
| 2019/0091736 | A1* | 3/2019 | Okutani | H01L 21/67034 |
| 2019/0295865 | A1* | 9/2019 | Hanawa | H01L 21/67075 |
| 2019/0333755 | A1* | 10/2019 | Hanawa | H01L 21/6715 |
| 2020/0263087 | A1 | 8/2020 | Lim et al. | |
| 2020/0381246 | A1* | 12/2020 | Nakai | H01L 21/02057 |
| 2020/0411307 | A1* | 12/2020 | Sasaki | H01L 21/02057 |
| 2020/0411309 | A1* | 12/2020 | Otsuji | B08B 7/0014 |
| 2021/0157242 | A1* | 5/2021 | Wen | C11D 7/3209 |

FOREIGN PATENT DOCUMENTS

| | | | | |
|---|---|---|---|---|
| JP | 2017-076817 A | | 4/2017 | |
| JP | 2018-028643 A | | 2/2018 | |
| JP | 2019-029402 A | | 2/2019 | |
| TW | 201734181 A | | 10/2017 | |
| WO | WO-2019024892 A1 | * | 2/2019 | ............. G03F 7/426 |

OTHER PUBLICATIONS

Notice of Allowance dated Mar. 18, 2022 for corresponding Korean Patent Application No. 10-2020-0074257.

* cited by examiner

FIG. 6
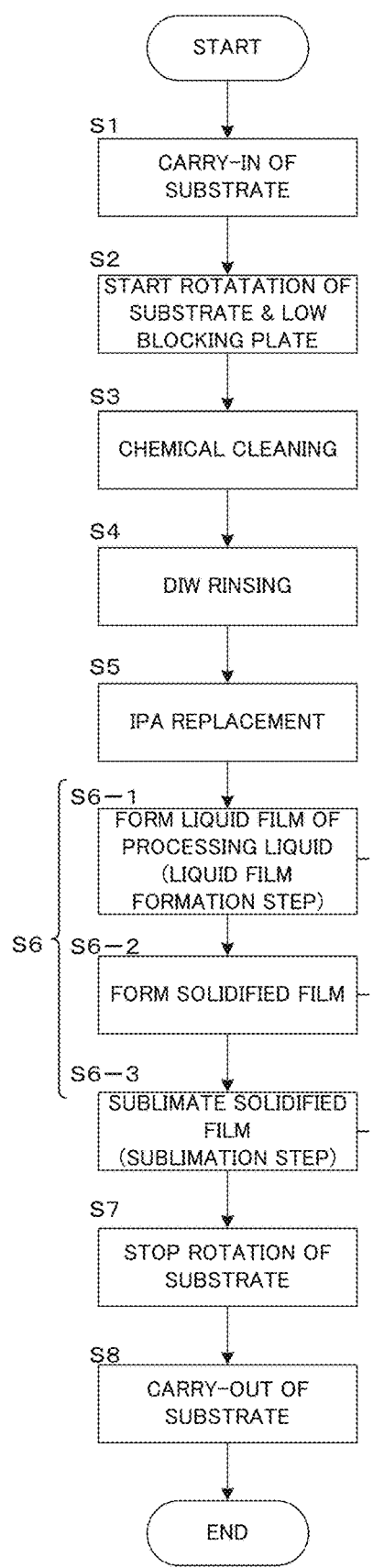
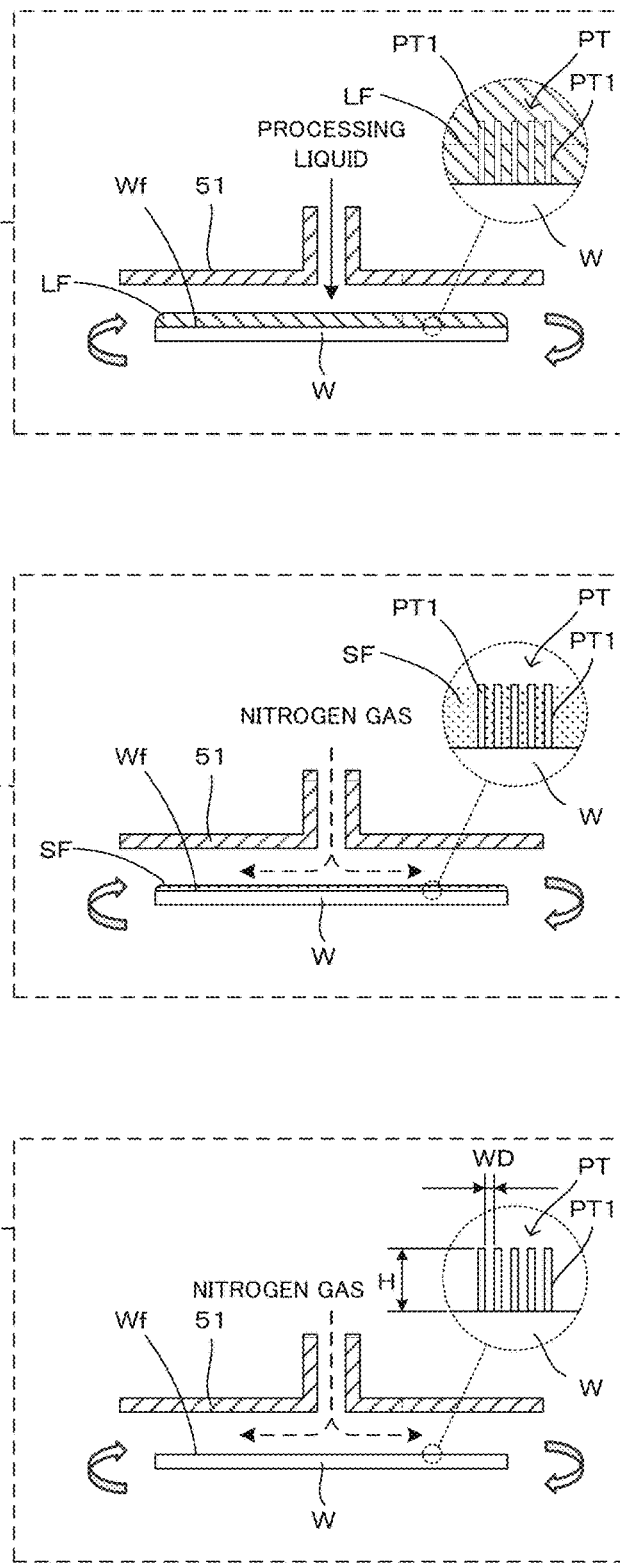

FIG. 7
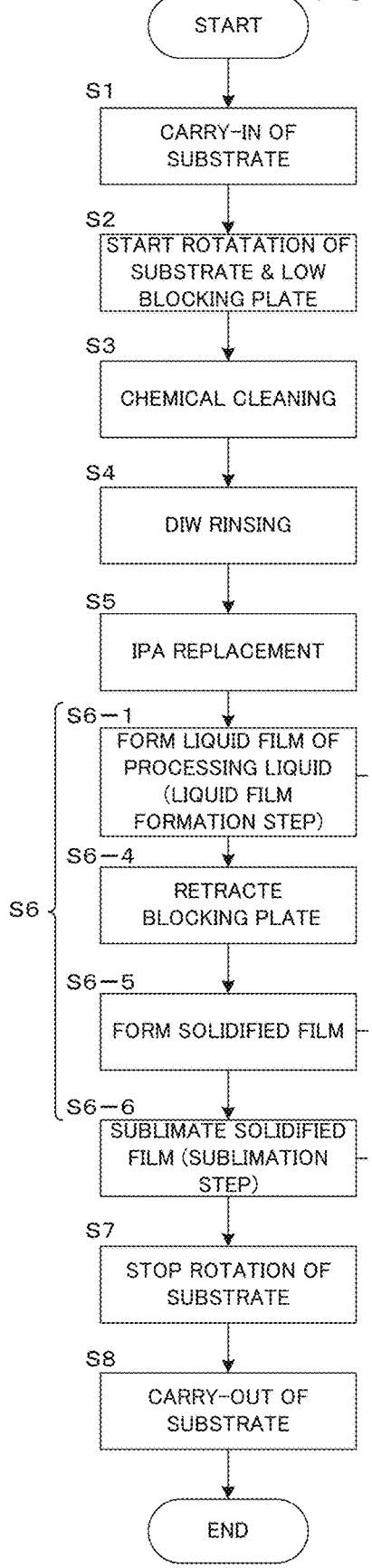
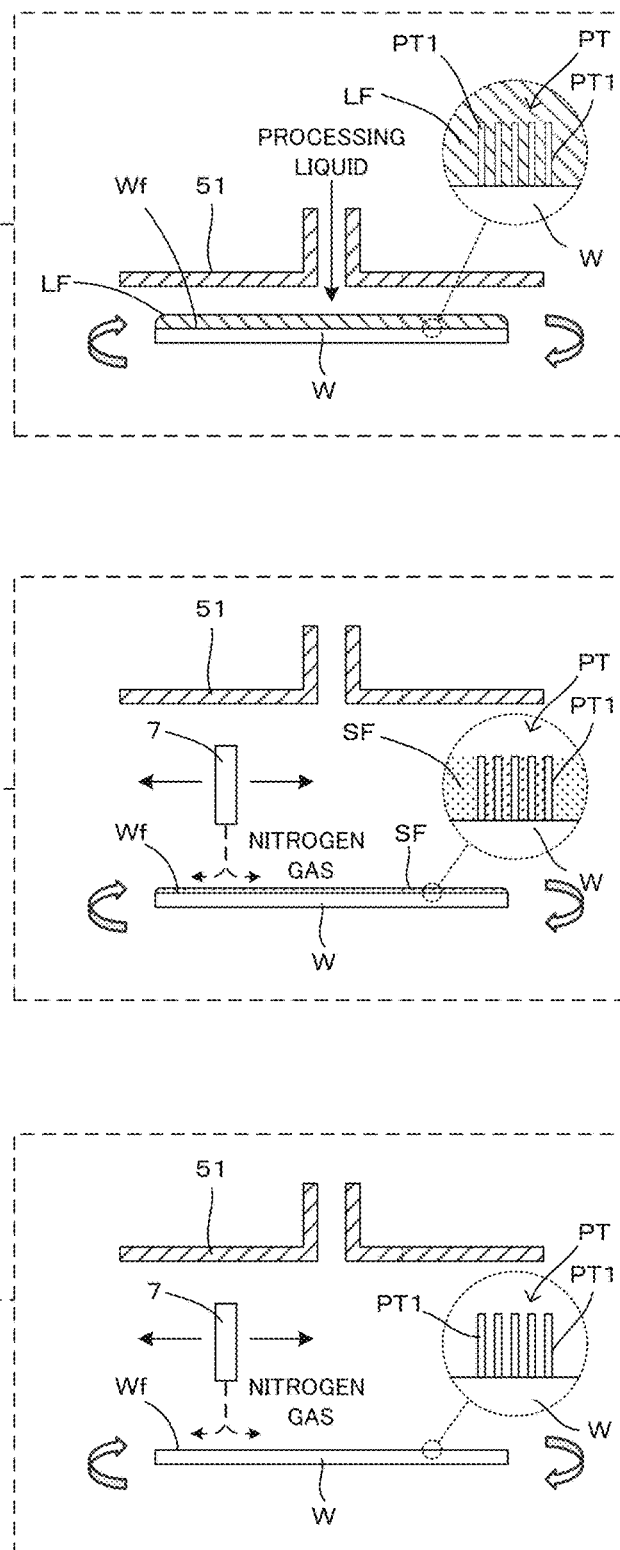

FIG. 8
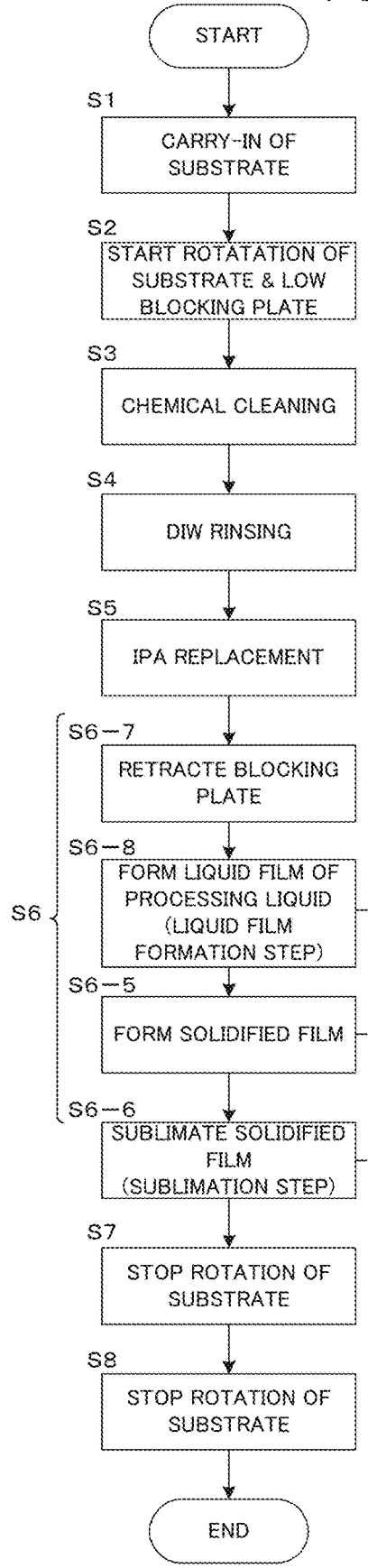
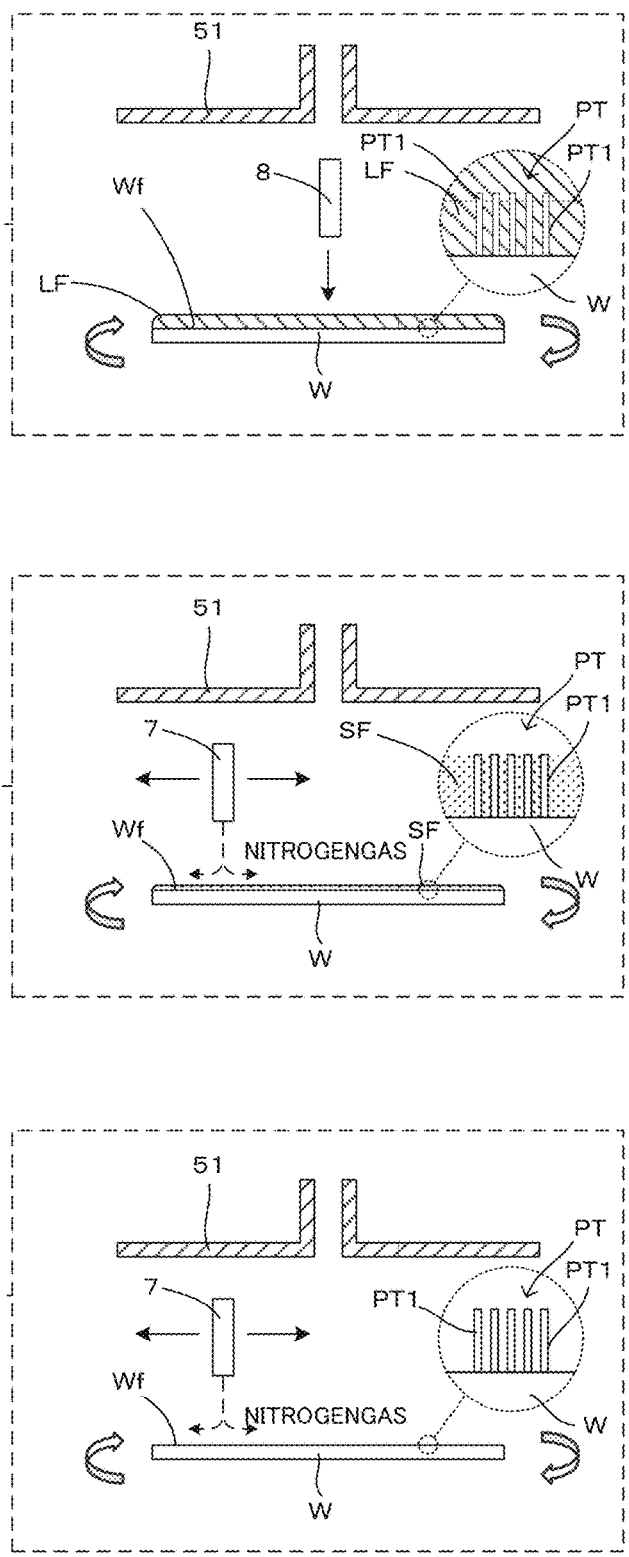

F I G. 10

| | | NUMBER OF ROTATIONS (rpm) | | | | | |
|---|---|---|---|---|---|---|---|
| | | 500 | 1000 | 1500 | 2000 | 2500 | 3000 |
| CONCENTRATION (vol.%) | 1.25 | ◎ | ○ | ○ | ○ | × | × |
| | 2.5 | × | ◎ | ◎ | ◎ | ○ | ○ |
| | 5 | × | △ | ○ | ◎ | ◎ | ◎ |

…

SUBSTRATE PROCESSING METHOD AND SUBSTRATE PROCESSING APPARATUS

CROSS REFERENCE TO RELATED APPLICATION

The disclosure of Japanese Patent Applications enumerated below including specifications, drawings and claims is incorporated herein by reference in its entirety:
No. 2019-120652 filed on Jun. 28, 2019; and
No. 2020-001888 filed on Jan. 9, 2020.

BACKGROUND OF THE INVENTION

1. Field of the Invention

This invention relates to a substrate processing method and a substrate processing apparatus for processing a substrate formed with a pattern on a front surface. Substrates include semiconductor wafers, liquid crystal display substrates, substrates for FPD (Flat Panel Display) such as organic EL (electroluminescence) display device, optical disk substrates, magnetic disk substrates, magneto-optical disk substrates, photomask substrates, ceramic substrates, solar cell substrates and the like.

2. Description of the Related Art

A manufacturing process of an electronic component such as a semiconductor device or a liquid crystal display device includes a step of forming a pattern by repeating a process of forming a film or etching on a front surface of a substrate. Further, after this pattern is formed, a cleaning process by a chemical, a rinsing process by a rinse liquid, a drying process and the like are performed in this order. With the miniaturization of patterns, the importance of the drying process has particularly increased. That is, a technique for suppressing or preventing the occurrence of pattern collapse has become important in the drying process. Accordingly, a substrate processing method has been proposed which dries a substrate by sublimation using a processing liquid in which camphor is dissolved in IPA (isopropyl alcohol), for example, as described in JP 2012-243869A.

In the above conventional technique, drying performance of the substrate is enhanced by using camphor, which is a typical example of a sublimable substance. However, depending on substrate processing conditions, the collapse of the pattern cannot be suppressed. Thus, the conventional technique has not developed enough to satisfy drying performance required at an electronic component manufacturing site.

This invention was developed in view of the above problem and aims to provide a substrate processing method and a substrate processing apparatus having excellent drying performance and capable of satisfactorily drying a substrate formed with a pattern on a front surface.

SUMMARY OF THE INVENTION

One aspect of the invention is a substrate processing method. The method comprises: a liquid film formation step of forming a liquid film of a processing liquid, in which cyclohexanone oxime is dissolved in a solvent, on a front surface of a substrate formed with a pattern by supplying the processing liquid to the front surface of the substrate; a solidified film formation step of forming a solidified film of the cyclohexanone oxime by solidifying the liquid film of the processing liquid; and a sublimation step of removing the solidified film from the front surface of the substrate by sublimating the solidified film.

Other aspect of the invention is a substrate processing apparatus. The apparatus comprises: a solvent storage that stores a solvent; a processing liquid storage that stores a processing liquid in which cyclohexanone oxime is dissolved in the same solvent as the solvent; and a processing liquid supply unit that supplies the concentration-adjusted processing liquid obtained by diluting the processing liquid with the solvent supplied from the solvent storage to a front surface of a substrate formed with a pattern.

According to the thus configured invention, sublimation drying can be performed using cyclohexanone oxime as a sublimable substance. Thus, the substrate can be satisfactorily dried while the collapse of the pattern is prevented under various substrate processing conditions.

All of a plurality of constituent elements of each aspect of the invention described above are not essential and some of the plurality of constituent elements can be appropriately changed, deleted, replaced by other new constituent elements or have limited contents partially deleted in order to solve some or all of the aforementioned problems or to achieve some or all of effects described in this specification. Further, some or all of technical features included in one aspect of the invention described above can be combined with some or all of technical features included in another aspect of the invention described above to obtain one independent form of the invention in order to solve some or all of the aforementioned problems or to achieve some or all of the effects described in this specification.

BRIEF DESCRIPTION OF THE DRAWINGS

FIG. 6 is a view showing contents of the substrate processing performed in the substrate processing apparatus of FIG. 1.

FIG. 7 is a view showing the second embodiment of the substrate processing method according to the invention.

FIG. 8 is a view showing contents of a substrate processing performed in the third embodiment of the substrate processing method according to the invention.

FIG. 10 is a view showing a summary of verification results of the substrate processing method according to the invention.

DETAILED DESCRIPTION OF THE PREFERRED EMBODIMENTS

First Embodiment

<<Overall Configuration of Substrate Processing Apparatus>>

Figure 1:
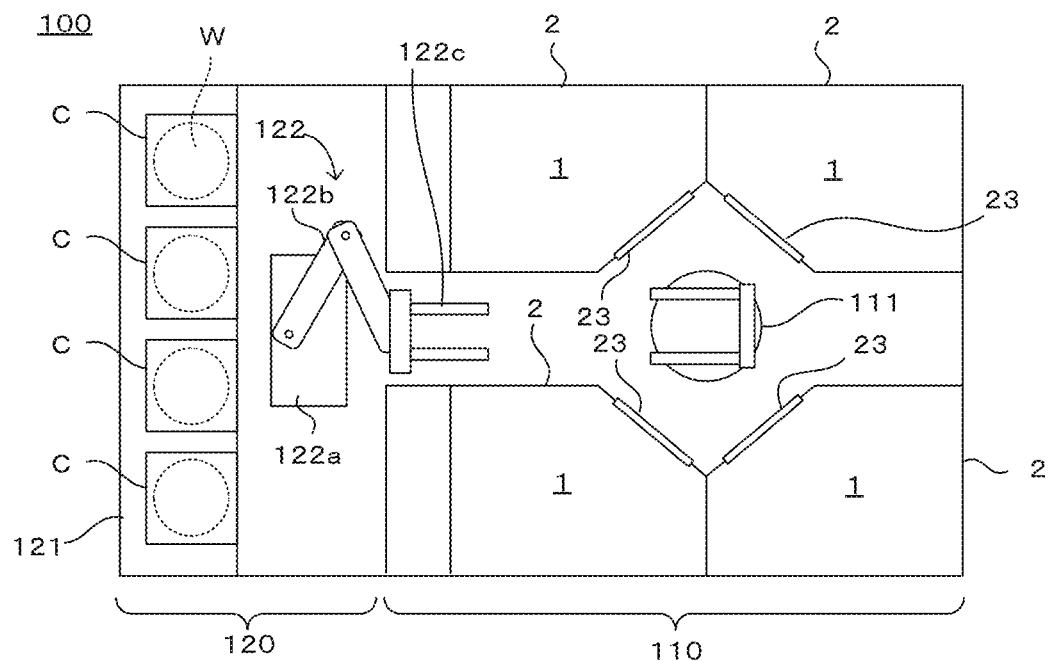
FIG. 1 is a plan view showing a schematic configuration of a first embodiment of a substrate processing apparatus according to the invention.
Figure 2:
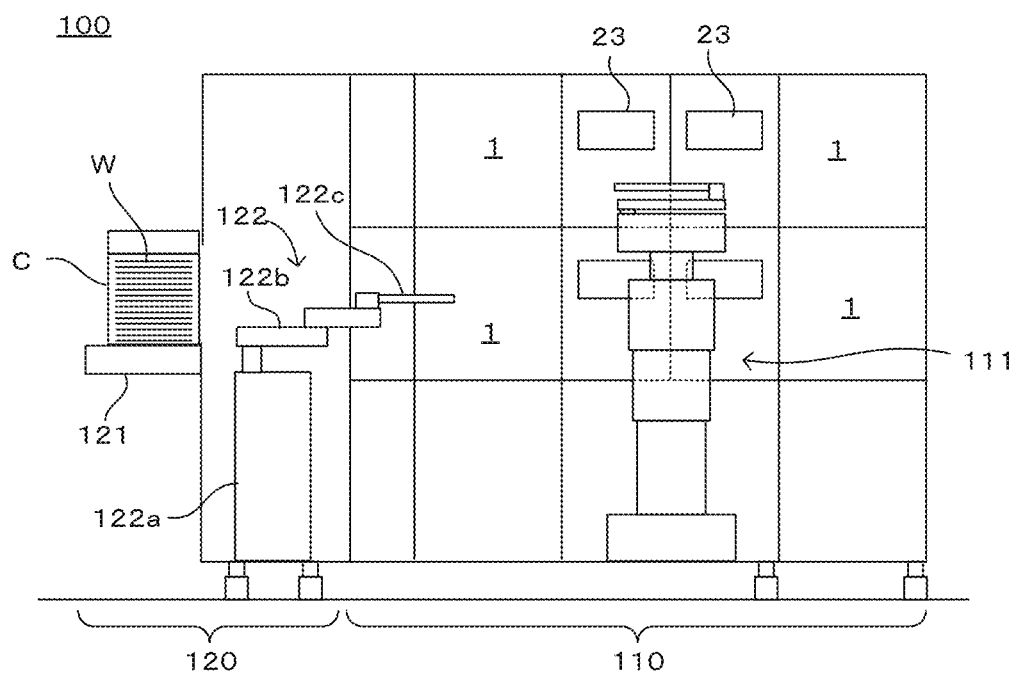
FIG. 2 is a side view of the substrate processing apparatus shown in FIG. 1.

FIG. 1 is a plan view showing a schematic configuration of a first embodiment of a substrate processing apparatus according to the invention. FIG. 2 is a side view of the substrate processing apparatus shown in FIG. 1. These figures are diagrams not showing the external appearance of the apparatus, but showing an internal structure of a substrate processing apparatus 100 by excluding an outer wall panel and other partial configurations. This substrate processing apparatus 100 is, for example, a single-wafer type apparatus installed in a clean room and configured to process substrates W each having a circuit pattern (hereinafter, referred to as a "pattern") only on one principal surface one by one. A first embodiment of a substrate processing method according to the invention is carried out in the substrate processing apparatus 100. In this specification, a pattern formation surface (one principal surface) formed with the pattern is referred to as a "front surface Wf" and the other principal surface not formed with the pattern on an opposite side is referred to as a "back surface Wb". Further, a surface facing down is referred to as a "lower surface" and a surface facing up is referred to as an "upper surface". Further, in this specification, the "pattern formation surface" means a surface of the substrate where an uneven pattern is formed in an arbitrary region regardless of whether the surface is flat, curved or uneven.

Here, various substrates such as semiconductor wafers, glass substrates for photomask, glass substrates for liquid crystal display, glass substrates for plasma display, substrates for FPD (Flat Panel Display), optical disk substrates, magnetic disk substrates and magneto-optical disk substrates can be applied as the "substrate" in this embodiment. Although the substrate processing apparatus used in processing semiconductor wafers is mainly described as an example with reference to the drawings below, application to the processing of various substrates illustrated above is also possible.

As shown in FIG. 1, the substrate processing apparatus 100 includes a substrate processing station 110 for processing the substrate W and an indexer station 120 coupled to this substrate processing station 110. The indexer station 120 includes a container holder 121 capable of holding a plurality of containers C for housing the substrates W (FOUPs (Front Opening Unified Pods), SMIF (Standard Mechanical Interface) pods, OCs (Open Cassettes) for housing a plurality of the substrates W in a sealed state), and an indexer robot 122 for taking out an unprocessed substrate W from the container C by accessing the container C held by the container holder 121 and housing a processed substrate W in the container C. A plurality of the substrates W are housed substantially in a horizontal posture in each container C.

The indexer robot 122 includes a base 122a fixed to an apparatus housing, an articulated arm 122b provided rotatably about a vertical axis with respect to the base 122a, and a hand 122c mounted on the tip of the articulated arm 122b. The hand 122c is structured such that the substrate W can be placed and held on the upper surface thereof. Such an indexer robot including the articulated arm and the hand for holding the substrate is not described in detail since being known.

The substrate processing station 110 includes a substrate conveyor robot 111 arranged substantially in a center in a plan view and a plurality of processing units 1 arranged to surround this substrate conveyor robot 11. Specifically, the plurality of (eight in this example) processing units 1 are arranged to face a space where the substrate conveyor robot 111 is arranged. The substrate conveyor robot 111 randomly accesses these processing units 1 and transfers the substrates W. On the other hand, each processing unit 1 performs a predetermined processing to the substrate W. In this embodiment, these processing units 1 have the same function. Thus, a plurality of the substrates W can be processed in parallel.

<<Configuration of Processing Units 1>>

Figure 3:
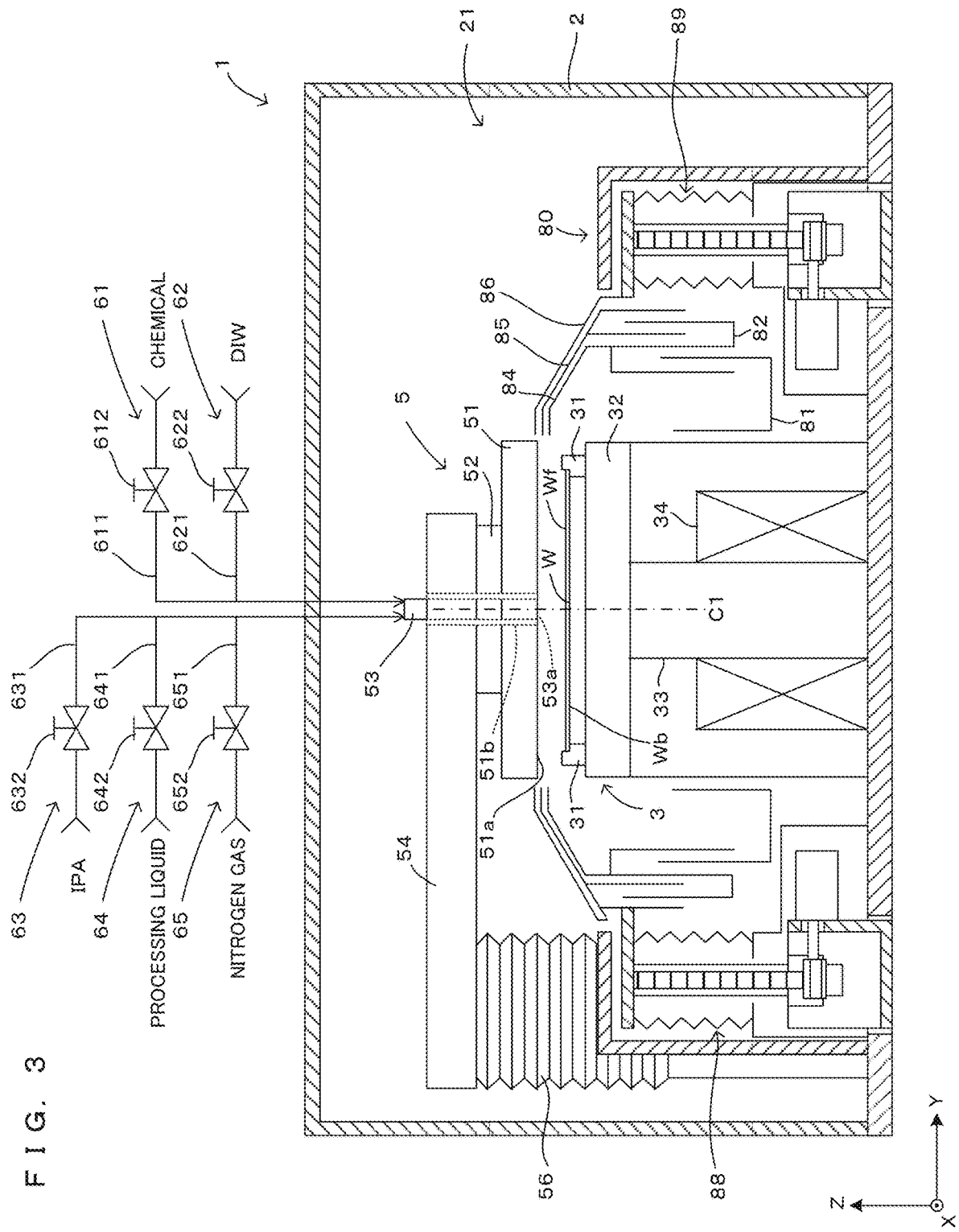
FIG. 3 is a partial sectional view showing the configuration of the processing unit.
Figure 4:
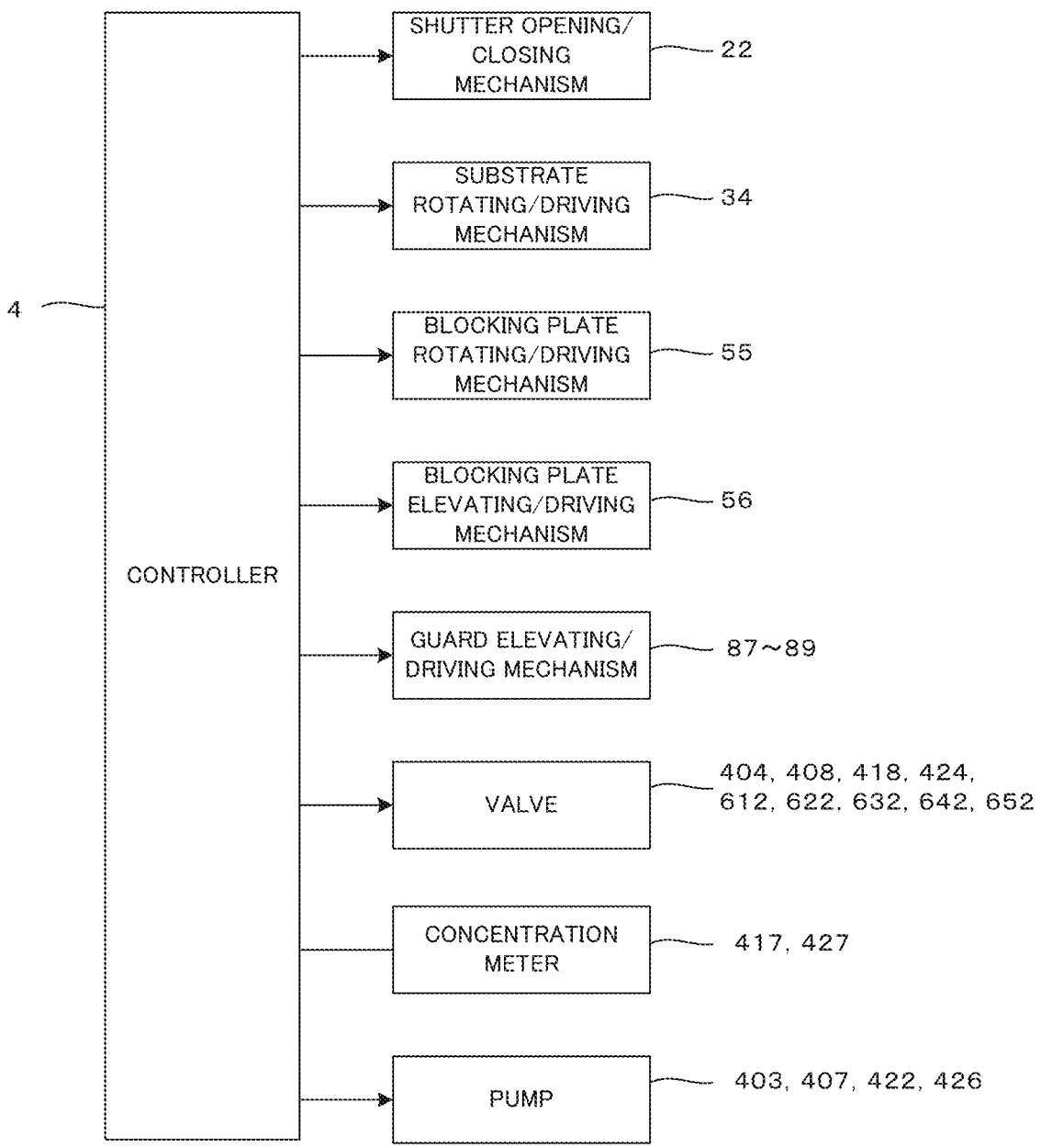
FIG. 4 is a block diagram showing an electrical configuration of a controller for controlling the processing unit.

FIG. 3 is a partial sectional view showing the configuration of the processing unit. FIG. 4 is a block diagram showing an electrical configuration of a controller for controlling the processing unit. Note that although a controller 4 is provided for each processing unit 1 in this embodiment, the plurality of processing units 1 may be controlled by one controller. Further, the processing units 1 may be controlled by a control unit (not shown) for controlling the entire substrate processing apparatus 100.

The processing unit 1 includes a chamber 2 having an internal space 21 and a spin chuck 3 housed in the internal space 21 of the chamber 2 to hold the substrate W. As shown in FIGS. 1 and 2, a shutter 23 is provided on a side surface of the chamber 2. A shutter opening/closing mechanism 22 (FIG. 4) is connected to the shutter 23, and the shutter 23 is opened/closed in response to an open/close command from the controller 4. More specifically, in the processing unit 1, the shutter opening/closing mechanism 22 opens the shutter 23 when an unprocessed substrate W is carried into the chamber 2, and the unprocessed substrate W is carried to the spin chuck 3 in a face-up state by the hand of the substrate conveyor robot 111. That is, the substrate W is placed on the spin chuck 3 with the front surface Wf faced up. If the hand of the substrate conveyor robot 111 is retracted from the chamber 2 after the substrate is carried in, the shutter opening/closing mechanism 22 closes the shutter 23. Then, a desired substrate processing is performed in a normal temperature environment by supplying a chemical, DIW (deionized water), an IPA, a processing liquid and a nitrogen gas to the front surface Wf of the substrate W as described later in the internal space 21 of the chamber 2. Further, after the substrate processing is finished, the shutter opening/closing mechanism 22 opens the shutter 23 again and the hand of the substrate conveyor robot 111 carries out the processed substrate W from the spin chuck 3. As just described, in this embodiment, the internal space 21 of the chamber 2 functions as a processing space in which the substrate processing is performed while the normal temperature environment is maintained. Note that the "normal temperature" means a temperature range of 5° C. to 35° C. in this specification.

The spin chuck 3 includes a plurality of chuck pins 31 for holding the substrate W, a spin base 32 formed into a disk shape along a horizontal direction to support the plurality of chuck pins 31, a center shaft 33 provided rotatably about an axis of rotation C1 parallel to a surface normal extending from a center of the front surface of the substrate W while being coupled to the spin base 32, and a substrate rotating/driving mechanism 34 for rotating the center shaft 33 about the axis of rotation C1 by a motor. The plurality of chuck pins 31 are provided on a peripheral edge part of the upper surface of the spin base 32. In this embodiment, the chuck pins 31 are arranged at equal intervals in a circumferential direction. If the motor of the substrate rotating/driving mechanism 34 operates in response to a rotation command from the controller 4 with the substrate W placed on the spin chuck 3 held by the chuck pins 31, the substrate W rotates about the axis of rotation C1. Further, the chemical, the IPA, the DIW, the processing liquid and the nitrogen gas are successively supplied to the front surface Wf of the substrate W from a nozzle provided in an atmosphere blocking mechanism 5 in response to a supply command from the controller 4.

The atmosphere blocking mechanism 5 includes a blocking plate 51, an upper spin shaft 52 provided to be integrally rotatable with the blocking plate 51 and a nozzle 53 penetrating in a vertical direction through a central part of the blocking plate 51. The blocking plate 51 is finished into a disk shape having a diameter substantially equal to or larger than that of the substrate W. The blocking plate 51 is arranged to face the upper surface of the substrate W held by the spin chuck 3 while being spaced apart. Thus, the lower surface of the blocking plate 51 functions as a circular substrate facing surface 51a facing the entire front surface Wf of the substrate W. Further, a hollow cylindrical through hole 51b penetrating in the vertical direction through the blocking plate 51 is formed in a central part of the substrate facing surface 51a.

The upper spin shaft 52 is provided rotatably about an axis of rotation (axis coinciding with the axis of rotation C1 of the substrate W) vertically extending through a center of the blocking plate 51. The upper spin shaft 52 has a hollow cylindrical shape. The inner peripheral surface of the upper spin shaft 52 is formed into a cylindrical surface centered on the above axis of rotation. An internal space of the upper spin shaft 52 communicates with the through hole 51b of the blocking plate 51. The upper spin shaft 52 is supported relatively rotatably on a support arm 54 horizontally extending above the blocking plate 51.

The nozzle 53 is arranged above the spin chuck 3. The nozzle 53 is supported by the support arm 54 in a state unrotatable with respect to the support arm 54. Further, the nozzle 53 is movable upward and downward integrally with the blocking plate 51, the upper spin shaft 52 and the support arm 54. A discharge port 53a is provided in a lower end part of the nozzle 53 and facing a central part of the front surface Wf of the substrate W held by the spin chuck 3.

A blocking plate rotating/driving mechanism 55 (FIG. 4) including an electric motor and the like is coupled to the blocking plate 51. The blocking plate rotating/driving mechanism 55 rotates the blocking plate 51 and the upper spin shaft 52 about the axis of rotation C1 with respect to the support arm 54 in response to a rotation command from the controller 4. Further, a blocking plate elevating/driving mechanism 56 is coupled to the support arm 54. The blocking plate elevating/driving mechanism 56 integrally moves the blocking plate 51, the upper spin shaft 52 and the nozzle 53 upward and downward in a vertical direction Z in response to an elevation command from the controller 4. More specifically, the blocking plate elevating/driving mechanism 56 moves the blocking plate 51, the upper spin shaft 52 and the nozzle 53 upward and downward between a blocking position (position shown in FIG. 3 and right-upper stages of FIGS. 6 and 7) where the substrate facing surface 51a is proximate to the front surface Wf of the substrate W held by the spin chuck 3 to substantially block a space above the front surface Wf from a surrounding atmosphere and a retracted position (position shown in right-middle and right-lower stages of FIG. 7, position shown in FIG. 8) retracted largely upward from the blocking position.

A chemical supply unit 61, a rinse liquid supply unit 62, an organic solvent supply unit 63, a processing liquid supply unit 64 and a gas supply unit 65 are connected to an upper end part of the nozzle 53.

The chemical supply unit 61 includes a chemical piping 611 connected to the nozzle 53 and a valve 612 disposed in the chemical piping 611. The chemical piping 611 is connected to a chemical supply source. In this embodiment, the chemical only has to have a function of cleaning the front surface Wf of the substrate W. For example, a chemical containing at least one of hydrofluoric acid (HF), hydrochloric acid, sulfuric acid, phosphoric acid and nitric acid can be, for example, used as an acidic chemical. Further, a chemical containing at least one of ammonia and a hydroxyl group can be, for example, used as an alkaline chemical. Note that, in this embodiment, hydrofluoric acid is used as the chemical. Thus, if the valve 612 is opened in response to an open/close command from the controller 4, a hydrofluoric acid chemical is supplied to the nozzle 53 and discharged toward a front surface central part of the substrate W from the discharge port 53a.

The rinse liquid supply unit 62 includes a rinse liquid piping 621 connected to the nozzle 53 and a valve 622 disposed in the rinse liquid piping 621. The rinse liquid piping 621 is connected to a rinse liquid supply source. In this embodiment, DIW is used as the rinse liquid. If the valve 622 is opened in response to an open/close command from the controller 4, the DIW is supplied to the nozzle 53 and discharged toward the front surface central part of the substrate W from the discharge port 53a. Note that, besides the DIW, any one of carbonated water, electrolytic ionized water, hydrogen water, ozone water and hydrochloric acid water having a diluted concentration (e.g. about 10 ppm to 100 ppm) may be used as the rinse liquid.

The organic solvent supply unit 63 is a unit for supplying an organic solvent having a larger specific weight than air, having a lower surface tension than water and serving as a low surface tension liquid. The organic solvent supply unit 63 includes an organic solvent piping 631 connected to the nozzle 53 and a valve 632 disposed in the organic solvent piping 631. The organic solvent piping 631 is connected to an organic solvent supply source. In this embodiment, IPA is used as the organic solvent. If the valve 632 is opened in response to an open/close command from the controller 4, the IPA is supplied to the nozzle 53 and discharged toward the front surface central part of the substrate W from the discharge port 53a. Note that, besides the IPA, methanol, ethanol, acetone, EG (ethylene glycol) and HFE (hydrofluoroether) can be, for example, used as the organic solvent. Further, the organic solvent may be not only composed of a single component, but also a liquid mixed with other component(s). For example, the organic solvent may be a mixed liquid of IPA and acetone or a mixed liquid of IPA and methanol.

The processing liquid supply unit 64 is a unit for supplying a processing liquid functioning as a drying auxiliary liquid in drying the substrate W held by the spin chuck 3 to the front surface Wf of the substrate W. The processing liquid supply unit 64 includes a processing liquid piping 641 connected to the nozzle 53 and a valve 642 disposed in the processing liquid piping 641. The processing liquid piping 641 is connected to a processing liquid supply part functioning as a processing liquid supply source. In this embodiment, a cyclohexanone oxime solution in which cyclohexanone oxime as a sublimable substance is dissolved in the IPA is used as the processing liquid. Note that, in this specification, "sublimability" means to have a property of phase transition of a single substance, a compound or a mixture from a solid state to a gaseous state or from a gaseous state to a solid state without passing through a liquid state and the "sublimable substance" means a substance having such sublimability. Further, the processing liquid is described in detail later.

Figure 5:
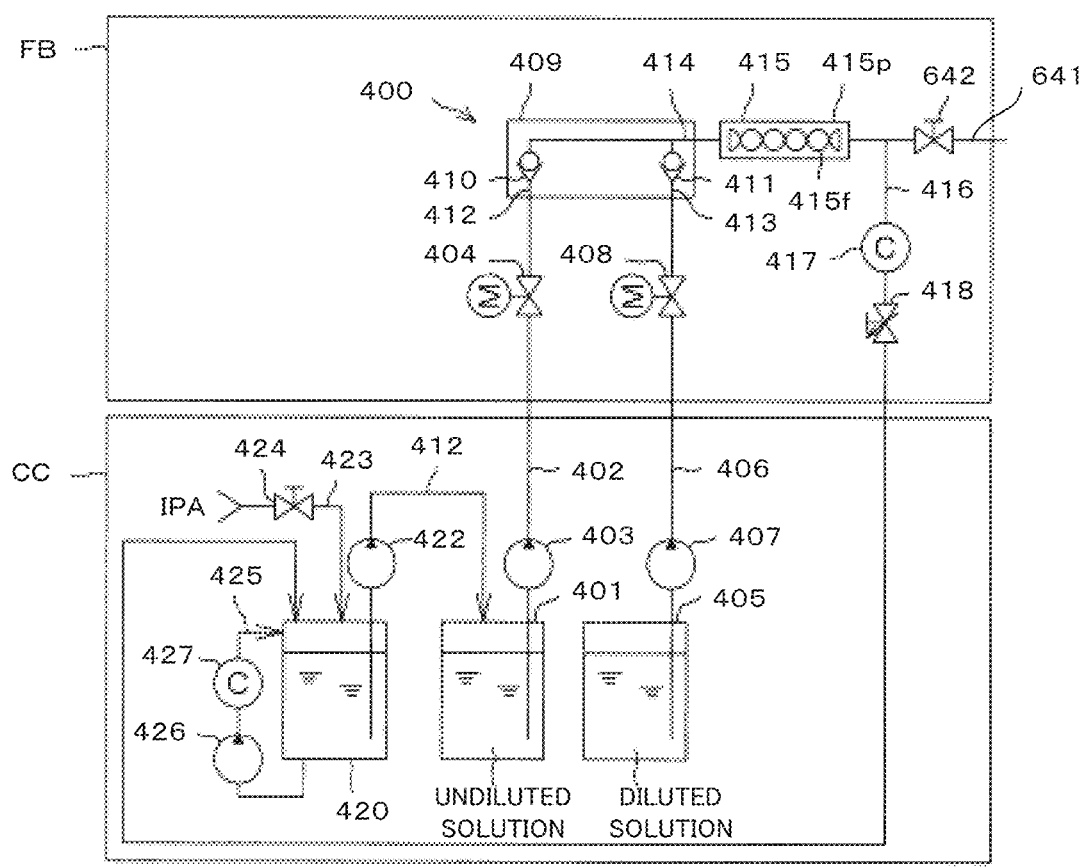
FIG. 5 is a diagram showing the configuration of the processing liquid supply part.

FIG. 5 is a diagram showing the configuration of the processing liquid supply part. FB, CC in FIG. 5 respectively denote a "fluid box" and a "cabinet". Further, in this embodiment, the processing liquid piping 641 extends into the fluid box of a processing liquid supply part 400 and the valve 642 is mounted in the processing liquid piping 641 in the fluid box FB so that the processing liquid can be switchingly supplied and stopped.

The processing liquid supply part 400 includes an undiluted solution tank 401 for storing a cyclohexanone oxime solution as an undiluted solution of the processing liquid, and a diluted solution tank 405 for storing a solvent (IPA in this embodiment) having the same name as a solvent contained in the undiluted solution as a diluted solution. The undiluted solution tank 401 is connected to a first individual flow passage 412 of a mixing valve 409 by a first individual piping 402. On the other hand, the undiluted solution tank 405 is connected to a second individual flow passage 413 of the mixing valve 409 by a second individual piping 406.

The undiluted solution in the undiluted solution tank 401 is fed to the mixing valve 409 by a first pump 403 disposed in the first individual piping 402. A flow rate of the undiluted solution fed from the undiluted solution tank 401 to the mixing valve 409 can be changed by a first electric valve 404 for opening and closing the inside of the first individual piping 402. Similarly, the diluted solution in the diluted solution tank 405 is fed to the mixing valve 409 by a second pump 407 disposed in the second individual piping 406. A flow rate of the diluted solution fed from the diluted solution tank 405 to the mixing valve 409 can be changed by a second electric valve 408 for opening and closing the inside of the second individual piping 406.

In this embodiment, both the first and second electric valves 404, 408 are electric needle valves. Here, at least one of the first and second electric valves 404, 408 may be an electric valve other than the electric needle valve. Note that the configuration of the electric needle valve is not described in detail since being known, but the opening and closing and degrees of opening of the electric valves 404, 408 are controlled by the controller 4.

As shown in FIG. 5, the mixing valve 409 includes a first check valve 410 for preventing a backflow of the liquid in the first individual flow passage 412, a second check valve 411 for preventing a backflow of the liquid in the second individual flow passage 413 and a collective flow passage 414 connected to downstream ends of the first and second individual flow passages 412, 413 in addition to the first and second individual flow passages 412, 413. Thus, if both the first and second electric valves 404, 408 are opened by the controller 4, the undiluted solution and the diluted solution are mixed with each other while flowing to a downstream side in the collective flow passage 414 of the mixing valve 409 (flow mixing step). In this way, the undiluted solution (cyclohexanone oxime solution) is diluted with the diluted solution (IPA) to prepare a processing liquid having a desired concentration.

The collective flow passage 414 of the mixing valve 409 is connected to the processing liquid piping 641. Further, in the processing liquid piping 641, an inline mixer 415 for stirring the processing liquid is disposed upstream of the valve 642 in the processing liquid piping 641 as shown in FIG. 5. The inline mixer 415 includes a pipe 415p disposed in the processing liquid piping 641. Further, a stirring fin 415f is arranged in the pipe 415p. The stirring fin 415f is structured to be twisted about an axis extending in a flowing direction of the liquid. Thus, the inline mixer 415 functions as a static mixer. That is, in the processing liquid supply part 400, the undiluted solution and the diluted solution supplied from the undiluted solution tank 401 and the diluted solution tank 405 are mixed by the mixing valve 409 and, thereafter, further mixed by the inline mixer 415. In this way, the sublimable substance and the solvent are uniformly mixed.

The processing liquid supply part 400 includes a branch piping 416 branched from the processing liquid piping 641. An upstream end of the branch piping 416 is connected to the processing liquid piping 641. Part of the processing liquid in the processing liquid piping 641 passes through the upstream end of the branch piping 641 and is supplied to the nozzle 53. On the other hand, the remaining processing liquid in the processing liquid piping 641 flows into the branch piping 416 from the upstream end of the branched piping 416. A downstream end of the branch piping 416 is connected to a replenishing tank 420. The downstream end of the branch piping 416 may be connected to the processing liquid piping 641 provided in another processing unit 1 or may be connected to a liquid discharging device (not shown).

The processing liquid supply part 400 may include a flow rate adjusting valve 418 for changing a flow rate of the processing liquid flowing from the processing liquid piping 641 to the branch piping 416. An opening degree of the flow rate adjusting valve 418 can be adjusted by the controller 4. Thus, the flow rate of the processing liquid flowing from the processing liquid piping 641 to the branch piping 416 is changed according to the opening degree of the flow rate adjusting valve 418. The processing liquid supply part 400 may include, instead of the flow rate adjusting valve 418, an orifice plate formed with a hole having a diameter smaller than an inner diameter of the branch piping 416. In this case, the processing liquid flows from the processing liquid piping 641 to the branch piping 416 at a flow rate corresponding to an area of the hole of the orifice plate.

The processing liquid supply part 400 includes a solution concentration meter 417 for measuring a concentration of the sublimable substance in the processing liquid. In FIG. 5, the solution concentration meter 417 is disposed in the branch piping 416. However, the disposed position of the solution concentration meter 417 is not limited to this and is any arbitrary position downstream of the mixing valve 409. For example, the solution concentration meter 417 may be arranged upstream or downstream of the inline mixer 415 or may be arranged in the nozzle 53. Alternatively, the solution concentration meter 417 may measure a concentration of the processing liquid discharged from the nozzle 53.

The solution concentration meter 417 is an optical concentration meter. The solution concentration meter 417 may be a concentration meter other than the optical concentration meter. The controller 4 changes a mixing ratio of the undiluted solution and the diluted solution, i.e. a ratio of the diluted solution to the undiluted solution, based on a detection value of the solution concentration meter 417. Specifically, the controller 4 changes an opening degree of at least one of the first and second electric valves 404, 408 based on the detection value of the solution concentration meter 417. In this way, a ratio of the sublimable substance contained in the processing liquid increases or decreases, and a concentration of the sublimable substance (cyclohexanone oxime)

in the processing liquid is adjusted to a value within a set concentration range. Note that the concentration range is described in detail later.

The processing liquid supply part 400 may include the replenishing tank 420 for storing a replenishing liquid to be supplied into the undiluted solution tank 401. The replenishing tank 420 is connected to the undiluted solution tank 401 by a replenishing piping 421. The replenishing liquid in the replenishing tank 420 is fed to the undiluted solution tank 401 by a replenishing pump 422 disposed in the replenishing piping 421. The replenishing liquid is a cyclohexanone oxime solution. A concentration of the sublimable substance in the replenishing liquid is lower than that of the sublimable substance in the undiluted solution.

The processing liquid supply part 400 includes a solvent piping 423 for supplying a solvent (IPA) into the replenishing tank 420 and a solvent valve 424 for opening and closing the inside of the solvent piping 423. The processing liquid supply part 400 further includes a circulation piping 425 for circulating the replenishing liquid in the replenishing tank 420, a circulation pump 426 for feeding the replenishing liquid in the replenishing tank 420 to the circulation piping 425, and a circulation concentration meter 427 for measuring a concentration of the sublimable substance in the replenishing liquid in the circulation piping 425. Upstream and downstream ends of the circulation piping 425 are connected to the replenishing tank 420.

The downstream end of the branch piping 416 branched from the processing liquid piping 641 is connected to the replenishing tank 420. The processing liquid flowing in the processing liquid piping 641 is supplied to the replenishing tank 420 via the branch piping 416 and mixed with the processing liquid in the replenishing tank 420. A concentration of the processing liquid is lower than that of the sublimable substance in the undiluted solution. A concentration of the sublimable substance in the replenishing liquid in the replenishing tank 420 is detected by the circulation concentration meter 427. If the concentration of the sublimable substance in the replenishing liquid is higher than a reference concentration, the controller 4 opens the solvent valve 424 to supply the solvent (IPA) into the replenishing tank 420. In this way, the concentration of the sublimable substance in the replenishing liquid decreases to be adjusted to the reference concentration.

The undiluted solution in the undiluted solution tank 401 contains the sublimable substance and the solvent. If the solvent evaporates from the undiluted solution, the concentration of the sublimable substance in the undiluted solution increases and the sublimable substance may be deposited. In this case, there is a possibility that an upstream end of the first individual piping 402 is clogged with a solid part of the sublimable substance and the undiluted solution does not flow or hardly flows in the first individual piping 402. If the replenishing liquid in the replenishing tank 420 is supplied to the undiluted solution tank 401, the concentration of the sublimable substance in the undiluted solution can be maintained below a saturation concentration and the deposition of the sublimable substance can be prevented.

The replenishing liquid may be regularly supplied from the replenishing tank 420 to the undiluted solution tank 401 or may be supplied according to the number of times of feeding the undiluted solution in the undiluted solution tank 401 to the first individual piping 402. Alternatively, the concentration of the sublimable substance in the undiluted solution in the undiluted solution tank 401 may be measured by a concentration meter and the replenishing liquid may be supplied from the replenishing tank 420 to the undiluted solution tank 401 according to a detection value of the concentration meter. Since the undiluted solution in the undiluted solution tank 401 is diluted with the replenishing liquid in either case, the upstream end of the first individual piping 402 can be prevented from being clogged with the solid part of the sublimable substance.

Referring back to FIG. 3, the description is continued. If the valve 642 is opened in response to an open/close command from the controller 4, the processing liquid (cyclohexanone oxime solution adjusted to a desired concentration) supplied from the processing liquid supply unit 64 is supplied to the nozzle 53 and discharged to the front surface central part of the substrate W from the discharge port 53a.

The gas supply unit 65 includes a gas supply piping 651 connected to the nozzle 53 and a valve 652 for opening and closing the gas supply piping 651. The gas supply piping 651 is connected to a gas supply source. In this embodiment, a dehumidified nitrogen gas is used as a gas. If the valve 652 is opened in response to an open/close command from the controller 4, the nitrogen gas is supplied to the nozzle 53 and blown toward the front surface central part of the substrate W from the discharge port 53a. Note that an inert gas such as a dehumidified argon gas may be used as the gas besides the nitrogen gas.

In the processing unit 1, an exhaust tub 80 is provided to surround the spin chuck 3. Further, a plurality of cups 81, 82 (first cup 81 and second cup 82) and a plurality of guards 84 to 86 (first to third guards 84 to 86) for receiving the processing liquid scattered around the substrate W are arranged between the spin chuck 3 and the exhaust tub 80. Further, guard elevating/driving mechanisms 87 to 89 (first to third guard elevating/driving mechanisms 87 to 89) are respectively coupled to the guards 84 to 86. The respective guard elevating/driving mechanisms 87 to 89 independently move the guards 84 to 86 upward and downward in response to an elevation command from the controller 4. Note that the guard elevating/driving mechanism 87 is not shown in FIG. 3.

The controller 4 includes an arithmetic unit such as a CPU, a storage unit such as a fixed memory device or a hard disk drive, and an input/output unit. A program to be executed by the arithmetic unit is stored in the storage unit. The controller 4 performs a substrate processing shown in FIG. 6 using the processing liquid described next by controlling each part of the apparatus in accordance with the above program. The details of the processing liquid and a substrate processing method are successively described in detail below.

<<Processing Liquid>>

Next, the processing liquid used in this embodiment is described below. The processing liquid of this embodiment contains at least cyclohexanone oxime and a solvent. The processing liquid of this embodiment functions to assist a drying process to remove a liquid present on a pattern formation surface of a substrate.

Cyclohexanone oxime is represented by the following chemical formula (1) and can function as a sublimable substance in the processing liquid of this embodiment.

[Chemical Formula 1]

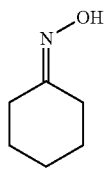

(1)

Further, cyclohexanone oxime has physical properties including a freezing point of 90.5° C., a boiling point of 210° C., a vapor pressure of 0.00717 Torr to 251.458 Torr (0.96 Pa to 33.52 kPa), a melting entropy $\Delta S$ of 30.0 J/mol·K, n-octanol/water partition coefficient of +1.2. At the freezing point of cyclohexanone oxime, a solidification (freezing) defect due to a drop of the freezing point at a narrow location on the pattern formation surface can be prevented. Further, a refrigerant at the time of solidification can be made unnecessary.

Cyclohexanone oxime is preferably present in a state dissolved in the solvent in the processing liquid.

The content of cyclohexanone oxime can be appropriately set, for example, according to supply conditions and the like when the processing liquid is supplied onto the pattern formation surface of the substrate, but is preferably 0.1% by volume or more and 10% by volume or less, more preferably 1.25% by volume or more and 5% by volume or less and particularly preferably 2% by volume or more and 4% by volume or less to the whole volume of the processing liquid. By setting the content of cyclohexanone oxime at 0.1% by volume or more, the collapse of a pattern in a partial or local region can be more satisfactorily suppressed even for a substrate having a fine pattern With a large aspect ratio. On the other hand, by setting the content of cyclohexanone oxime at 10% by volume or less, the solubility of cyclohexanone oxime in the solvent at normal temperature can be improved and cyclohexanone oxime can be uniformly dissolved. Further, in this specification, "solubility" means, for example, that 10 g or more of cyclohexanone oxime dissolved in 100 g of the solvent at 23° C.

The solvent can function as a solvent for dissolving cyclohexanone oxime. The solvent is specifically at least one type selected from a group composed of alcohols, ketones, ethers cycloalkanes and water.

The alcohols are not particularly limited and examples thereof include methyl alcohol (melting point: -98° C., n-octanol/water partition coefficient: -0.82 to -0.66), ethyl alcohol (melting point: -117° C., n-octanol/water partition coefficient: -0.32), isopropyl alcohol (melting point: -90° C., n-octanol/water partition coefficient: +0.05), n-butyl alcohol (melting point: -90° C., n-octanol/water partition coefficient: +0.88), tert-butyl alcohol (melting point: 25° C., n-octanol/water partition coefficient: +0.3) and cyclohexanol (melting point: 23° C. to 25° C., n-octanol/water partition coefficient: +1.2).

The ketones are not particularly limited. For example, acetone (melting point: -95° C., n-octanol/water partition coefficient: -0.24) and the like are cited as such.

The ethers are not particularly limited. For example, propylene glycol monomethyl ethyl acetate (melting point: -87° C., n-octanol/water partition coefficient: +0.43) and the like are cited as such.

The cycloalkanes are not particularly limited. For example, cyclohexane (melting point: 7° C., n-octanol/water partition coefficient: +3.4) and the like are cited as such.

The water is not particularly limited. For example, pure water and the like are cited as such.

All of the illustrated solvents can be solely used in combination with cyclohexanone oxime. Further, two or more types of the illustrated solvents can also be used in combination with cyclohexanone oxime.

Further, the solvent is preferably such that cyclohexanone oxime shows good solubility therein.

Furthermore, out of the illustrated solvents, isopropyl alcohol and the like are preferable in terms of being able to satisfactorily suppress a pattern collapse in a partial or local region.

The n-octanol/water partition coefficient of the solvent is preferably in a range of -0.85 to +1.5, more preferably in a range of -0.82 to +1.2 and particularly preferably in a range of 0 to +1.2.

A vapor pressure of the solvent is preferably 500 Pa or more, more preferably 1000 Pa or more and particularly preferably 5000 Pa or more at normal temperature. As a difference from the above vapor pressure of cyclohexanone oxime increases, a solidified film can be formed even if cyclohexanone oxime has a low concentration. As a result, a reduction of processing cost and a reduction of residues can be achieved. Note that the vapor pressure of the solvent is preferably set at 10 KPa or less in terms of reducing loads on the pipings and the like by the vapor pressure.

A processing liquid production method according to this embodiment is not particularly limited. For example, a method for adding crystals of cyclohexanone oxime to a solvent to contain a certain amount of cyclohexanone oxime at normal or atmospheric pressure is cited as such. Note that "at atmospheric pressure" means an environment at 0.7 atmospheres to 1.3 atmospheres with respect to normal atmospheric pressure (1 atmosphere, 1013 hPa).

In the processing liquid production method, filtering may be performed after the crystals of cyclohexanone oxime are added to the solvent. In this way, when the liquid is removed by supplying the processing liquid onto the pattern formation surface of the substrate, the production of residues derived from the processing liquid on the pattern formation surface can be reduced or prevented. A filtering method is not particularly limited. For example, filter filtration and the like can be employed as such.

The processing liquid of this embodiment can be stored at normal temperature. However, the processing liquid is preferably stored at low temperature (e.g. about 5° C.) in terms of suppressing a change of the cyclohexanone oxime concentration due to the evaporation of the solvent. When the processing liquid stored at low temperature is used, the processing liquid having the temperature thereof set at operating temperature, room temperature or the like is preferably used in terms of preventing the mixing of moisture due to condensation.

<<Substrate Processing Method>>

Next, the substrate processing method using the substrate processing apparatus 100 shown in FIG. 1 is described with reference to FIG. 6. FIG. 6 is a view showing contents of the substrate processing performed in the substrate processing apparatus of FIG. 1. In FIG. 6 (and FIGS. 7 and 8 to be described later), a flow chart of the substrate processing performed in one processing unit 1 is shown on a left side. Further, a liquid film formation step, a solidified film formation step and a sublimation step are schematically shown and a part of the front surface Wf of the substrate W is enlargedly shown in right-upper, right-middle and right-lower stages. However, for the purpose of facilitating understanding, dimensions, numbers and the like of parts are shown in an exaggerated or simplified manner if necessary.

A processing target in the substrate processing apparatus 100 is, for example, a silicon wafer, and an uneven pattern PT is formed on a front surface Wf, which is a pattern formation surface. In this embodiment, projections PT1 have a height in a range of 100 to 600 nm and a width in a range of 5 to 50 nm. A shortest distance between two adjacent projections PT1 (shortest width of a recess) is in a range of 5 to 150 nm. An aspect ratio, i.e. a value obtained by dividing a height by a width (height H/width WD), of the projections PT1 is 5 to 35.

Further, the pattern PT may be such that linear pattern elements formed by fine trenches are repeatedly arranged. Further, the pattern PT may be formed by providing a plurality of fine holes (voids or pores) in a thin film. The pattern PT includes, for example, an insulation film. Further, the pattern PT may include a conductive film. More specifically, the pattern PT may be formed by a laminated film obtained by laminating a plurality of films and further include an insulation film and a conductive film. The pattern PT may be a pattern constituted by a single-layer film. The insulation film may be a silicon oxide film or a silicon nitride film. Further, the conductive film may be an amorphous silicon film having impurities introduced thereto to reduce resistance or may be a metal film (e.g. TiN film). Further, the pattern PT may be formed by a front-end process or may be formed by a back-end process. Furthermore, the pattern PT may be a hydrophobic film or may be a hydrophilic film. Examples of the hydrophilic film include a TEOS film (one type of a silicon oxide film).

Further, each step shown in FIG. 6 is processed in an atmospheric environment unless otherwise specified. Here, the atmospheric environment indicates an environment at 0.7 atmospheres to 1.3 atmospheres with respect to normal atmospheric pressure (1 atmosphere, 1013 hPa). Particularly, if the substrate processing apparatus 100 is arranged in a clean room at a positive pressure, an environment for the front surface Wf of the substrate W is higher than one atmosphere.

Before an unprocessed substrate W is carried into the processing unit 1, the controller 4 gives a command to each part of the apparatus and the processing unit 1 is set in an initial state. Specifically, the shutter 23 (FIGS. 1, 2) is closed by the shutter opening/closing mechanism 22. The spin chuck 3 is positioned and stopped at a position suitable for the loading of the substrate W by the substrate rotating/driving mechanism 34, and the chuck pins 31 are set in an open state by an unillustrated chuck opening/closing mechanism. The blocking plate 51 is positioned at the retracted position by the blocking plate elevating/driving mechanism 56, and the rotation of the blocking plate 51 by the blocking plate rotating/driving mechanism 55 is stopped. Any of the guards 84 to 86 is moved downward and positioned. Further, any of the valves 612, 622, 632, 642 and 652 is closed.

When the unprocessed substrate W is conveyed by the substrate conveyor robot 111, the shutter 23 is opened. As the shutter 23 is opened, the substrate W is carried into the internal space 21 of the chamber 2 by the substrate conveyor robot 111 and transferred to the spin chuck 3 with a front surface Wf faced up. Then, the chuck pins 31 are set in a closed state and the substrate W is held by the spin chuck 3 (Step S1: carry-in of the substrate).

Following the carry-in of the substrate W, the substrate conveyor robot 111 is retracted to the outside of the chamber 2. Further, after the shutter 23 is closed again, the controller 4 increases a rotation speed (number of rotations) of the spin chuck 3 to a predetermined processing speed (e.g. 800 to 1200 rpm within a range of about 10 to 3000 rpm) by controlling the motor of the substrate rotating/driving mechanism 34 and maintains that processing speed. Further, the controller 4 lowers the blocking plate 51 from the retracted position and arranges the blocking plate 51 at the blocking position by controlling the blocking plate elevating/driving mechanism 56 (Step S2). Further, the controller 4 causes the first guard 84 to face a peripheral end surface of the substrate W by controlling the guard elevating/driving mechanisms 87 to 89 and raising the first to third guards 84 to 86 to upper positions.

When the rotation of the substrate W reaches the processing speed, the controller 4 subsequently opens the valve 612. In this way, the chemical (HF in this embodiment) is discharged from the discharge port 53a of the nozzle 53 and supplied to the front surface Wf of the substrate W. On the front surface Wf of the substrate W, the HF moves to a peripheral edge part of the substrate W by receiving a centrifugal force caused by the rotation of the substrate W. In this way, the entire front surface Wf of the substrate W is cleaned by the HF (Step S3). At this time, the HF having reached the peripheral edge part of the substrate W is discharged laterally of the substrate W from the peripheral edge part of the substrate W, received by an inner wall of the first guard 84 and fed to a waste liquid processing facility outside the apparatus along an unillustrated waste liquid path. This chemical cleaning by the supply of the HF is continued for a cleaning time determined in advance. Upon the elapse of the cleaning time, the controller 4 closes the valve 612 and stops the discharge of the HF from the nozzle 53.

Following the chemical cleaning, the rinsing process by the rinse liquid (DIW) is performed (Step S4). In this DIW rinsing, the controller 4 opens the valve 622 while maintaining the positions of the first to third guards 84 to 86. In this way, the DIW is supplied as the rinse liquid from the discharge port 53a of the nozzle 53 to a central part of the front surface Wf of the substrate W subjected to the chemical cleaning process. Then, the DIW moves to the peripheral edge part of the substrate W by receiving the centrifugal force caused by the rotation of the substrate W. In this way, the HF adhering on the substrate W is washed away by the DIW. At this time, the DIW discharged from the peripheral edge part of the substrate W is discharged laterally of the substrate W from the peripheral edge part of the substrate W and fed to the waste liquid processing facility outside the apparatus similarly to the HF. This DIW rinsing is continued for a rinsing time determined in advance. Upon the elapse of the rinsing time, the controller 4 closes the valve 622 and stops the discharge of the DIW from the nozzle 53.

After the DIW rinsing is completed, a replacement process by an organic solvent (IPA in this embodiment) having a lower surface tension than the DIW is performed (Step S5). In IPA replacement, the controller 4 causes the third guard 86 to face the peripheral end surface of the substrate W by controlling the guard elevating/driving mechanisms 87, 88 and lowering the first and second guards 84, 85 to lower positions. Then, the controller 4 opens the valve 632. In that way, the IPA is discharged as a low surface tension liquid toward the central part of the front surface Wf of the substrate W having the DIW adhered thereto from the discharge port 53a of the nozzle 53. The IPA supplied to the front surface Wf of the substrate W spreads over the entire front surface Wf of the substrate W by receiving the centrifugal force caused by the rotation of the substrate W. In this way, the DIW (rinse liquid) adhering to the front surface Wf is replaced by the IPA in the entire front surface Wf of the substrate W. Note that the IPA moving on the front surface Wf of the substrate W is discharged laterally from the substrate W from the peripheral edge part of the substrate W, received by an inner wall of the third guard 86 and fed to a recovery facility along an unillustrated recovery path. This IPA replacement is continued for a replacement time determined in advance. Upon the elapse of the replacement time, the controller 4 closes the valve 632 and stops the discharge of the IPA from the nozzle 53.

Following the IPA replacement, a sublimation drying step (Step S6) corresponding to a first embodiment of the substrate processing method of the invention is performed. This sublimation drying step includes a liquid film formation step of forming a liquid film of the processing liquid (Step S6-1), a solidified film formation step of forming a solidified film of cyclohexanone oxime by solidifying the liquid film of the processing liquid (Step S6-2) and a sublimation step of removing the solidified film from the front surface Wf of the substrate W by sublimating the solidified film (Step S6-3).

In Step S6-1, the controller 4 causes the second guard 85 to face the peripheral end surface of the substrate W by controlling the second guard elevating/driving mechanism 88 and raising the second guard 85 to the upper position. Then, the controller 4 opens the valve 642. In that way, as shown in the right-upper stage of FIG. 6, the processing liquid (cyclohexanone oxime solution) is discharged as the drying auxiliary liquid toward the central part of the front surface Wf of the substrate W having the IPA adhered thereto from the discharge port 53a of the nozzle 53 and supplied to the front surface Wf of the substrate W. The processing liquid on the front surface Wf of the substrate W spreads over the entire front surface Wf of the substrate W by receiving the centrifugal force caused by the rotation of the substrate W. In this way, the IPA adhering to the front surface Wf is replaced by the processing liquid in the entire front surface W of the substrate W and a liquid film LF of the processing liquid is formed on the front surface Wf as shown in the right-upper stage of FIG. 6. A thickness of the liquid film LF is larger than the height of the projections PT1 and the entire pattern PT is immersed in the liquid film LF. Further, it is desirable to adjust the thickness of the liquid film LF by appropriately changing the rotation speed of the substrate W within a range of 300 rpm to 3000 rpm according to a concentration of cyclohexanone oxime contained in the processing liquid and the height and aspect ratio of the projections PT1. For example, if it is desired to thicken the liquid film LF, the rotation speed may be set low. Conversely, if it is desired to thin the liquid film LF, the rotation speed may be set high. If the liquid film LF having a desired film thickness is formed in this way, the controller 4 closes the valve 642 and stops the discharge of the processing liquid from the nozzle 53.

In the following Step S6-2, the controller 4 opens the valve 652. In that way, dehumidified nitrogen gas is discharged toward the front surface Wf of the substrate W rotating while being covered by the liquid film LF as shown in the right-middle stage of FIG. 6. In this embodiment, the evaporation of a solvent component, i.e. IPA, in the processing liquid is promoted by rotating the substrate W. Associated with that, a concentration of a solute component, i.e. cyclohexanone oxime, in the processing liquid increases, thereby exceeding a saturation concentration of the solvent (IPA) (or heat of vaporization is deprived of). In this way, cyclohexanone oxime, which is the sublimable substance contained in the liquid film LF of the processing liquid, is deposited to form a solidified film SF in a solid state on the front surface Wf of the substrate W. Further, the deposition of the solidified film SF is promoted by blowing the nitrogen gas in parallel with the rotation of the substrate W. Here, the valve 652 may be opened, i.e. the discharge of the nitrogen gas may be started, at a timing before or after the start of the deposition of cyclohexanone oxime. Further, although the discharge of the nitrogen gas is not essential to form the solidified film of cyclohexanone oxime, it is desirable to combine the discharge of the nitrogen gas to improve throughput.

Subsequently, the controller 4 performs the sublimation step (S6-3). The controller 4 causes the third guard 85 to face the peripheral end surface of the substrate W by controlling the second guard elevating/driving mechanism 88 and lowering the second guard 85 to the lower position. Note that although the controller 4 keeps the rotation speed of the substrate W from the formation step of the solidified film SF (Step S6-2), the rotation speed may be accelerated to a higher speed. Further, the controller 4 rotates the blocking plate 51 in the same direction and at the same speed as the rotation of the substrate W by controlling the blocking plate rotating/driving mechanism 55. According to the rotation of the substrate W, a contact speed of the solidified film SF with a surrounding atmosphere increases. In this way, the sublimation of the solidified film SF can be promoted and the solidified film SF can be sublimated in a short time. However, the rotation of the blocking plate 51 is not essential, but arbitrary in the sublimation step.

Further, in the sublimation step S6-3, the controller 4 keeps the open state of the valve 652 from the formation of the solidified film SF and the dehumidified nitrogen gas is discharged toward the central part of the front surface Wf of the substrate W in a rotating state from the discharge port 53a of the nozzle 53 as shown in the right-lower stage of FIG. 6. In this way, the sublimation step can be performed while a blocking space sandwiched between the front surface Wf of the substrate W and the substrate facing surface 51a of the blocking plate 51 is held in a low humidity state. In this sublimation step S6-3, heat of sublimation is deprived of as the solidified film SF is sublimated, and the solidified film SF is maintained at a temperature equal to or lower than the freezing point (melting point) of cyclohexanone oxime. Thus, the melting of the sublimable substance, i.e. cyclohexanone oxime, constituting the solidified film SF can be effectively prevented. Since no liquid phase is present between the pattern elements of the pattern PT on the front surface Wf of the substrate W in this way, the substrate W can be dried while a problem of the collapse of the pattern PT is mitigated.

Upon the elapse of a sublimation time determined in advance after the start of the sublimation drying step S6, the controller 4 stops the rotation of the spin chuck 3 by controlling the motor of the substrate rotating/driving mechanism 34 in Step S7. Further, the controller 4 stops the rotation of the blocking plate 51 by controlling the blocking plate rotating/driving mechanism 55 and raises the blocking plate 51 from the blocking position to the retracted position and positions the blocking plate 51 by controlling the blocking plate elevating/driving mechanism 56. Furthermore, the controller 4 retracts all the guards 86 to 88 downward from the peripheral end surface of the substrate W by controlling the third guard elevating/driving mechanism 89 and lowering the third guard 86.

Thereafter, after the controller 4 opens the shutter 23 (FIGS. 1 and 2) by controlling the shutter opening/closing mechanism 22, the substrate conveyor robot 111 enters the internal space of the chamber 2 and carries out the processed substrate W released from the chuck pins 31 to the outside of the chamber 2 (Step S8). Note that if the carry-out of the substrate W is completed and the substrate conveyor robot 111 is separated from the processing unit 1, the controller 4 closes the shutter 23 by controlling the shutter opening/closing mechanism 22.

As described above, in this embodiment, the liquid film LF is formed by replacing the IPA adhering to the front surface Wf of the substrate W with the processing liquid in which cyclohexanone oxime, which is one of the sublimable substances, is dissolved in the solvent. Subsequently, after cyclohexanone oxime is deposited and the solidified film SF of cyclohexanone oxime is formed, the solidified film SF is sublimated. That is, the solidified film SF is removed from the front surface Wf of the substrate W without passing through a liquid state. Thus, it is possible to dry the substrate W while preventing the collapse of the pattern PT by using the substrate processing method according to this embodiment.

Further, in the above embodiment, the undiluted solution tank 401 is connected to the mixing valve 409 by the first individual piping 402, and the diluted solution tank 405 is connected to the mixing valve 409 by the second individual piping 406. The concentration of the processing liquid is adjusted by supplying the undiluted solution (cyclohexanone oxime solution) of the processing liquid from the undiluted solution tank 401 and the diluted solution (IPA) from the diluted solution tank 405 to the mixing valve 409 and mixing these solutions. Thus, it is possible to dilute an expensive undiluted solution provided from a vendor and adjust to a concentration suitable for substrate processing conditions such as the type and number of rotations of the substrate W as described in detail later. Further, even if the concentrations of the processing liquid stored in the replenishing tank 420 and the undiluted solution slightly vary, the concentration of the sublimable substance (cyclohexanone oxime) in the processing liquid can be stabilized and the substrate W can be satisfactorily dried.

Second Embodiment

In the above first embodiment, the entire liquid film LF is solidified by blowing the nitrogen gas toward the central part of the front surface Wf of the substrate W from the discharge port 53a of the nozzle 53 with the blocking plate 51 positioned at the blocking position as shown in the right-middle stage of FIG. 6. Thus, in and around the central part of the front surface WF, the dehumidified nitrogen gas is directly supplied and the solidification process progresses relatively quickly. In contrast, the amount of steam of the solvent (IPA) increases in the nitrogen gas with distance from the central part in a radial direction of the substrate W. As a result, a solidification speed at a peripheral edge part of the liquid film LF is slower than that in the central part and uniform solidification in the entire front surface Wf of the substrate W is difficult in some cases. Accordingly, the nitrogen gas may be discharged toward the front surface Wf of the substrate W by a dedicated nitrogen gas nozzle (second embodiment).

FIG. 7 is a view showing the second embodiment of the substrate processing method according to the invention. This second embodiment largely differs from the first embodiment in that a dedicated nozzle 7 for discharging the dehumidified nitrogen gas toward a front surface Wf of a substrate W is provided and a solidified film formation step (Step S6-2) and a sublimation step (Step S6-3) are performed using this nozzle 7. Specifically, the method is performed as in the first embodiment from the carry-in of the substrate (Step S1) to processing liquid film formation (Step S6-1).

On the other hand, if the liquid film LF is formed, the blocking plate 51 is raised from the blocking position to the retracted position (Step S6-4) as shown in FIG. 7. In this way, a space sufficient to scan the nozzle 7 in a horizontal direction is formed between the front surface Wf of the substrate W held by the spin chuck 7 and the blocking plate 51. Thereafter, as shown in a right-middle stage of FIG. 7, the dehumidified nitrogen gas is discharged toward the front surface Wf of the substrate W from a discharge port 71 provided on the lower end of the nozzle 7 while the nozzle 7 is scanned along the front surface Wf of the rotating substrate W. Here, a path extending from a position right above the central part of the substrate W in a radial direction of the substrate W can be, for example, employed as a scanning path for the nozzle 7. Further, the nitrogen gas may be continuously discharged from the nozzle 7 while the nozzle 7 is reciprocally scanned along this path. In this way, the dehumidified nitrogen gas is directly supplied to each part of the front surface Wf of the substrate W. As a result, as compared to the first embodiment, a solidified film SF can be formed with high uniformity over the entire front surface Wf of the substrate W (Step S6-5). Further, a sublimation step (Step S6-6) can also be performed with high uniformity over the front surface Wf.

By performing such a sublimation drying step (Step S6 (=S6-1, S6-4, S6-5, S6-6)), the sublimation drying of the substrate W can be performed while the collapse of the pattern PT is more effectively prevented. Thereafter, as in the first embodiment, the rotation of the substrate is stopped (Step S7) and the substrate is carried out (Step S8).

Third Embodiment

In the above first embodiment, the blocking plate 51 is utilized in the entire sublimation drying step (Step S6). Further, in the above second embodiment, the blocking plate 51 is utilized in a part of the sublimation drying step (Step S6), i.e. in the processing liquid film formation (Step S6-1). However, the blocking plate 51 is not essential in performing the sublimation drying step (Step S6) and, for example, the entire sublimation drying step (Step S6) may be performed without utilizing the blocking plate 51 (third embodiment).

FIG. 8 is a view showing contents of a substrate processing performed in the third embodiment of the substrate processing method according to the invention. In the third embodiment, a nozzle 7 for discharging a nitrogen gas is provided as in the second embodiment and a processing liquid discharging nozzle 8 for discharging a processing liquid is provided in the processing units 1 shown in FIG. 1.

In the third embodiment, the method is performed as in the first and second embodiments from the carry-in of the substrate (Step S1) to the IPA replacement (Step S5). On the other hand, if the IPA replacement is completed, a sublimation drying step (Step S6) to be described next is performed. First, the blocking plate 51 is raised from the blocking position to the retracted position (Step S6-7). Following that, the processing liquid discharging nozzle 8 moves in a space formed between a front surface Wf of a substrate W held by the spin chuck 3 and the blocking plate 51 and is positioned at the position right above the central part of the substrate W while the blocking plate 51 is kept positioned at the retracted position. This processing liquid discharging nozzle 8 is connected to the processing liquid piping 641. Then, the processing liquid is discharged toward the front surface Wf of the rotating substrate W from the processing liquid discharging nozzle 8. In this way, a liquid film LF of the processing liquid is formed on the front surface Wf of the substrate W (Step S6-8). Further, thereafter, a solidified film SF is sublimated and removed (Step S6-6) after the solidified film SF is formed as in the second embodiment (Step S6-5).

Fourth Embodiment

In the above first to third embodiments, the solidified film formation step (Step S6-2, S6-5) is performed while the rotation speed (number of rotations) of the substrate W is kept constant, but a filling process (dwell) of filling the sublimable substance in the pattern PT may be performed in combination with the solidification process by temporarily reducing the rotation speed of the substrate W in the solidified film formation step (fourth embodiment).

Figure 9:
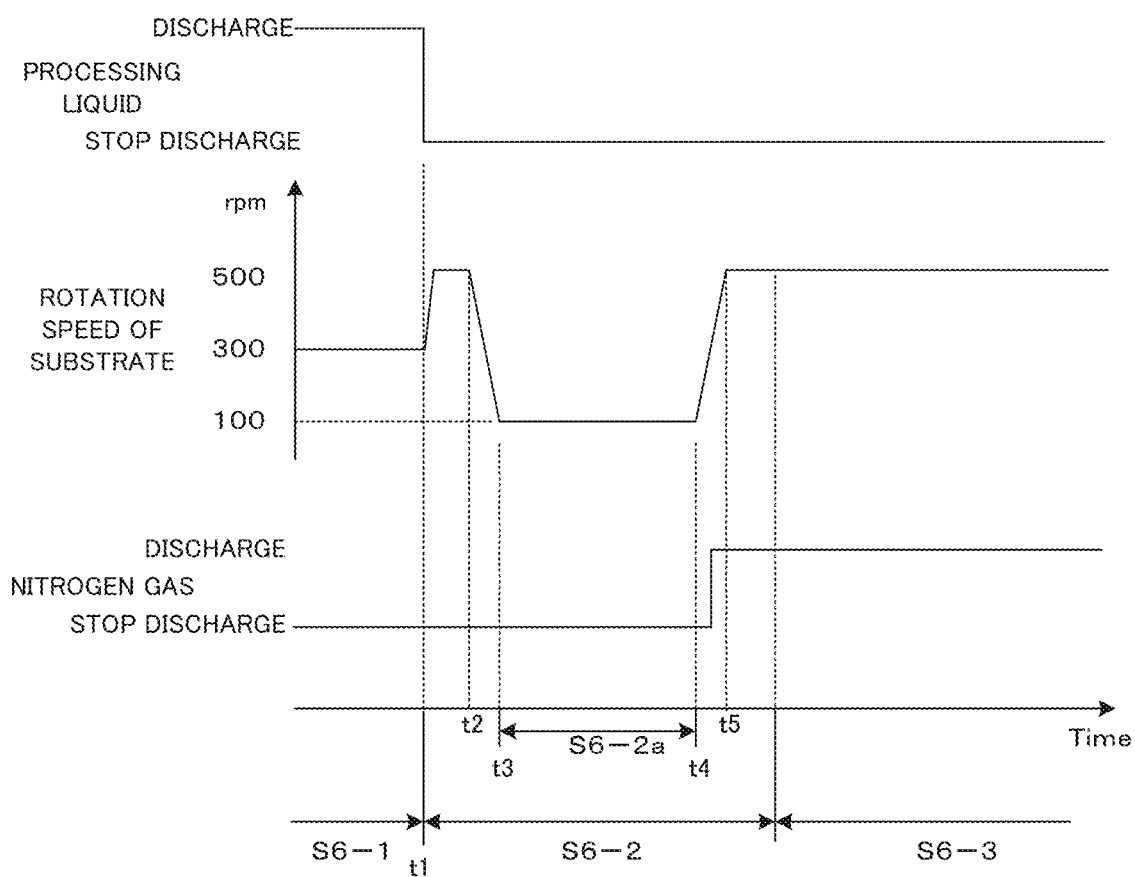
FIG. 9 is a timing chart of a substrate processing performed in the fourth embodiment of the substrate processing method according to the invention.

FIG. 9 is a timing chart of a substrate processing performed in the fourth embodiment of the substrate processing method according to the invention. "Processing liquid", "rotation speed of substrate" and "N$_2$ gas" in FIG. 9 respectively indicate a discharge timing of the processing liquid, a change of the rotation speed of the substrate W and a discharge timing of the nitrogen gas. This fourth embodiment largely differs from the first embodiment in that a solidified film formation step (Step S6-2) includes a filling process (Step S6-2a) and the other configuration is basically the same as in the first embodiment. Accordingly, the following description is centered on points of difference and the same components are denoted by the same reference signs and not described.

In the fourth embodiment, as shown in FIG. 9, a liquid film LF of the processing liquid is formed by discharging the processing liquid to a front surface Wf of a substrate W rotating, for example, at 300 rpm (liquid film formation step: Step S6-1). At timing t1 at which the liquid film formation step is completed, the controller 4 increases the rotation speed up to 500 rpm and keeps the rotation speed for a predetermined time (e.g. 2 seconds) after closing the valve 642 to stop the discharge of the processing liquid from the nozzle 53, whereby excess processing liquid is spun off from the substrate W. Note that, in the liquid film formation step of Step S6-1, after the rotation speed of the substrate W is set at 500 rpm at the time of discharging the processing liquid, the rotation speed of the substrate W may be kept as it is even if the discharge of the processing liquid is stopped.

Following that, the controller 4 decelerates the rotation speed to a rotation speed suitable for the filling process (100 rpm in this embodiment) by controlling the motor of the substrate rotating/driving mechanism 34 (timing t3) and maintains that rotation speed until timing t4. The processing liquid is leveled and a thickness of the liquid film LF is made uniform over the entire front surface Wf of the substrate W while the substrate W is rotated at a low speed (timings t3 to t4) in this way. Thus, the sublimable substance equally enters the pattern PT on the entire front surface Wf of the substrate W at the same time as the sublimable substance (cyclohexanone oxime) is deposited. In addition, due to low speed rotation, the evaporated solvent component (IPA evaporation in this embodiment) is easily uniformly stored above the front surface Wf of the substrate W and an evaporation speed of the solvent component from the liquid film LF is uniform in the front surface Wf of the substrate W. At timing t4 at which the filling process (Step S6-2a) of the sublimable substance is completed, the controller 4 increases the rotation speed to promote solidification for a time (=t5-t4) by controlling the motor of the substrate rotating/driving mechanism 34. Further, during acceleration, the controller 4 opens the valve 652 and discharges the nitrogen gas toward the liquid film LF immediately before solidification. In this way, the entire front surface Wf of the substrate W is solidified at once. Following that, a sublimation step (Step S6-3) is performed.

As described above, in the fourth embodiment, it is possible to suppress the variation of the solidification time in the surface of the substrate W and cause crystals of the sublimable substance to uniformly grow for the pattern PT since the filling process is included in the solidified film formation step.

Further, in this embodiment, the filling process (Step S6-2a) of the sublimable substance is performed with the blocking plate 51 lowered and arranged at the blocking position. Thus, an atmosphere of the solvent can be uniformly formed on the front surface Wf of the substrate W, and the variation of the solidification time can be more satisfactorily suppressed within the surface of the substrate W. As a result, the substrate W can be more satisfactorily dried while the collapse of the pattern PT is prevented at various substrate processing conditions.

Note that although the rotation speed is increased and the nitrogen gas is discharged simultaneously after the filling process (Step S6-2a) of the sublimable substance in the fourth embodiment, the discharge of the nitrogen gas may be started before or after an increase of the rotation speed. Further, a time (=t4−t5) during which the substrate W is rotated at a low speed may be set, for example, at 15 seconds to 35 seconds, further desirably at 20 seconds to 30 seconds.

Further, in the case of performing the filling process, the sublimation step (Step S6-3) may be started before the sublimable substance filled between the pattern elements of the pattern PT is completely solidified. That is, the solid part of the sublimable substance may be sublimated while being maintained in a pre-crystal transition state before crystallization. In this way, the solid part of the sublimable substance is removed from the front surface Wf of the substrate W without passing through a crystallized state. Thus, the influence of stress due to the crystallization of the solid part of the sublimable substance can be reduced to further effectively reduce the collapse of the pattern PT on the substrate W.

Further, although the filling process (Step S6-2a) is included in the solidified film formation step (Step S6-2) of the first embodiment in the fourth embodiment, the above filling process may be included in the solidified film formation steps (Step S6-5) of the second and third embodiments.

Fifth Embodiment

Although the atmosphere blocking mechanism 5 is utilized in the above first to fourth embodiments, it is not altogether essential to equip the atmosphere blocking mechanism 5 in the substrate processing apparatus in applying the substrate processing method according to the invention. Specifically, the invention can be applied also to a substrate processing apparatus not equipped with the atmosphere blocking mechanism 5.

As described above, Step S6-1 corresponds to an example of a "liquid film formation step" of the invention, Steps S6-2, S6-5 correspond to an example of a "solidified film formation step" of the invention, and Steps S6-3, S6-6 correspond to an example of a "sublimation step" of the invention. Further, the IPA corresponds to an example of a "solvent" of the invention, but there is no limitation to this.

The solvent preferably shows compatibility with cyclohexanone oxime in a melted state if cyclohexanone oxime in the melted state is mixed. Further, in the case of dissolving cyclohexanone oxime serving as a solute, the solvent preferably shows solubility in cyclohexanone oxime. Specifically, at least one type selected from pure water, DIW, aliphatic hydrocarbon, aromatic hydrocarbon, ester, alcohol, ketone, cycloalkane and ether is, for example, cited as such. More specifically, at least one type selected from pure water, DIW, methanol, ethanol, IPA, butanol, n-butyl alcohol, ethylene glycol, propylene glycol, NMP, DMF, DMA, DMSO, hexane, toluene, PGMEA (propylene glycol monomethyl ether acetate), PGME (propylene glycol monomethyl ether), PGPE (propylene glycol monopropyl ether), PGEE (propylene glycol monoethyl ether), GBL, acetyl acetone, 3-pethanone, 2-heptanone, ethyl lactate, cyclohexanone, dibutyl ether, HFE (hydrofluoroether), ethyl nonafluoroisobutyl ether, ethyl nonafluorobutyl ether, m-xylene hexafluoride and cyclohexane is cited as such.

Further, in the above embodiments, the undiluted solution tank 401 and the diluted solution tank 405 respectively correspond to examples of a "processing liquid storage" and a "solvent storage" of the invention. Further, the first and second individual pipings 402, 406 respectively correspond to examples of a "first piping" and a "second piping" of the invention. Further, the mixing valve 409 corresponds to an example of a "mixing member" of the invention. Furthermore, the undiluted solution stored in the undiluted solution tank 401 corresponds to a "processing liquid in which cyclohexanone oxime is dissolved in the same solvent as the solvent" of the invention, and the processing liquid fed from the collective flow passage 414 of the mixing valve 409 via the processing liquid piping 641 corresponds to a "concentration-adjusted processing liquid" of the invention.

Note that the invention is not limited to the above embodiments and various changes other than the aforementioned ones can be made without departing from the gist of the invention. For example, although the sublimation step (Step S6-3, S6-6) is performed after the solidified film formation step (Step S6-2, S6-5) is completed in the above embodiments, the both steps may partially overlap.

Further, although the substrate W is rotated and the nitrogen gas is discharged toward the front surface Wf of the substrate W to solidify the processing liquid in the solidified film formation step (Step S6-2, S6-5) in the above embodiments, solidification may be promoted by further supplying a solvent such as temperature-adjusted DIW to the back surface Wb (FIG. 1) of the substrate W.

Further, although the concentration of the sublimable substance (cyclohexanone oxime) in the processing liquid is adjusted by mixing the undiluted solution and the diluted solution using the mixing valve 409 in the above embodiments, the solvent may be supplied from the diluted solution tank 405 to the undiluted solution tank 401 via a piping (corresponding to an example of a "third piping" of the invention). That is, the concentration is adjusted in the undiluted solution tank 401 and the concentration-adjusted processing liquid may be fed from the undiluted solution tank 401 to the nozzle via the processing liquid piping 641.

Examples

A preferred mode of the invention is specifically described with reference to Examples below. However, the invention is, of course, not limited by the following Examples. Thus, it is, of course, possible to carry out the mode by adding appropriate changes within a range suitable for the gist described above and below and those are all included in the technical scope of the invention.

<Relationship of Concentration and Rotation Speed>

In manufacturing an electronic component such as a semiconductor device or a liquid crystal display device, it has become necessary to form a pattern having a high aspect ratio on a front surface of a substrate such as a silicon wafer. However, it has become difficult to satisfactorily dry the substrate formed with this pattern. Accordingly, substrates formed with a pattern having an aspect ratio of 18.4 (hereinafter, referred to as "substrates A") were prepared as an example of substrates formed with a pattern having a high aspect ratio, and verified as follows.

First, a substrate processing was performed in the procedure shown in FIG. 6 using the processing liquid described in JP 2012-243869A, i.e. the processing liquid in which the sublimable substance (camphor) was dissolved in IPA (hereinafter, referred to as a "conventional processing liquid"). Here, sublimation drying was performed in various combinations (rotation speed, concentration) while each of a rotation speed of the substrate and a concentration of the sublimable substance in the processing liquid (hereinafter, merely referred to as a "concentration") is made different. However, when collapse rates of the patterns was checked for the substrates A after the sublimation drying, the pattern had been collapsed at a collapse rate of 100% or close to 100% in any of the combinations.

In contrast, when the substrate processing was performed in the procedure shown in FIG. 6 using the processing liquid described in the above embodiments, i.e. the processing liquid in which the sublimable substance (cyclohexanone oxime) was dissolved in the IPA (hereinafter, referred to as a "processing liquid of this application"), it was confirmed that the sublimation drying could be performed at a pattern collapse rate of close to zero. Here, the solubility of cyclohexanone oxime in the IPA is about 10% by volume, and the concentration is desirably set at 10% by volume or less in the processing liquid of this application to uniformly disperse cyclohexanone oxime in the IPA. Accordingly, the processing liquids of this application having a concentration of 1.25% by volume, 2.5% by volume and 5% by volume were prepared and the sublimation drying was performed while the rotation speed in the sublimation drying step (Step S6) was switched in stages of 500 rpm, 1000 rpm, 1500 rpm, 2000 rpm, 2500 rpm and 3000 rpm. Then, the pattern collapse rate in each combination was verified. The result is as shown in FIG. 10. In FIG. 10, "⊚" indicates that the pattern collapse rate was below 1%, "○" indicates that the pattern collapse rate was 1% or more and below 5%, "Δ" indicates that the pattern collapse rate was 5% or more and below 20% and "×" indicates that the pattern collapse rate was 20% or more.

As is clear from FIG. 10, even the substrate A having such a high aspect ratio that the pattern collapse cannot be prevented with the conventional processing liquid can be satisfactorily dried using the processing liquid of this application.

A range where an excellent result is obtained (dotted range in FIG. 10) is proportionally related to the concentration and the rotation speed. That is, it is desirable to set a lower rotation speed of the substrate A as the concentration decreases in order to effectively suppress or prevent the pattern collapse. Since the solubility of cyclohexanone oxime in the IPA is about 10% by volume as described above, the concentration is desirably set at 10% by volume or less. However, in terms of achieving a reduction of running cost by suppressing the used amount of the sublimable substance (cyclohexanone oxime) and achieving a reduction of the rotation speed of the substrate A, the concentration is desirably set at 5% by volume or less. On the other hand, by reducing the concentration, an absolute amount of the sublimable substance contained in the processing liquid is also reduced. Thus, the concentration is desirably set to be at least 0.1% by volume or more to accomplish satisfactory sublimation drying.

Further, substrates formed with a pattern having a higher aspect ratio than the substrate A, specifically substrates formed with a pattern having an aspect ratio of 22.6 (hereinafter, referred to as "substrates B") were prepared and an experiment similar to the above one was conducted. Then, it was found that the sublimation drying could be performed while the pattern collapse was suppressed by using the processing liquid of this application. Particularly, in the case of performing the substrate processing in the procedure shown in FIG. 6 in a combination of a concentration of 0.76% by volume of the processing liquid of this application and a rotation speed of the substrate of 300 rpm, the pattern collapse rate could be suppressed to 3.2%.

<Types of Substrates>

In manufacturing an electronic component such as semiconductor device or a liquid crystal display device, a front-end process and a back-end process are performed. For example, in a semiconductor device such as LSI, elements such as FETs (field effect transistors), capacitors and the like are formed on a front surface of a substrate such as a silicon wafer by the front-end process. With a progress in miniaturization, a pattern having a high aspect ratio is formed by the front-end process. Although the above substrates A, B are also manufactured by the front-end process, substrates having an aspect ratio of 35 exist under the current circumstances. Accordingly, when the processing liquid of this application was used for these substrates, the sublimation drying could be performed while the occurrence of pattern collapse was suppressed.

Further, a plurality of wiring layers and the like are formed on the front surface of the substrate subjected to the front-end process by the back-end process. A wiring pitch becomes wider toward an upper layer in consideration of connection to external terminals. Thus, an aspect ratio of a pattern formed by the back-end process is smaller than that formed by the front-end process and about 6 to 7 under the current circumstances. However, a pattern is formed between interlayer insulation layers made of a low dielectric material (LOW-K material) in the back-end process due to a technical request such as a reduction of capacitance between proximate wirings (inter-wiring capacitance). For example, SiOC in which $SiO_2$ is doped with carbon is used. The SiOC is lower in hardness than silicon wafers and the like. Thus, the pattern collapse is a big problem although the aspect ratio is relatively low. When the processing liquid of this application was used also for such substrates, the sublimation drying was possible while the occurrence of pattern collapse was suppressed.

<Surface Properties of Substrate>

If a wet treatment is applied to a substrate formed with a pattern on a front surface, a hydrophilization treatment such as the irradiation of ultraviolet rays to the front surface of the substrate may be applied. This is to facilitate the entrance of a liquid between pattern elements by making surface properties of the substrate hydrophilic. Note that hydrophilicity mentioned here means, for example, that a contact angle is 30° or less.

On the other hand, in the case of performing the sublimation drying after the wet treatment is performed by this liquid, the pattern collapse easily occurs since the front surface of the substrate is hydrophilic. In fact, when the sublimation drying was performed in the procedure shown in FIG. 6 using the conventional processing liquid, pattern collapse performance was different due to a difference in surface properties of substrates having the same pattern. That is, the sublimation drying could be satisfactorily performed without causing the pattern collapse for the substrates having hydrophobic surface properties. In contrast, the pattern collapse could not be suppressed in the hydrophilic substrates.

In contrast, when the substrate processing was performed in the procedures shown in the above embodiments using the processing liquid of this application, the substrate processing could be performed while the pattern collapse was suppressed in both cases of the hydrophobic and hydrophilic front surfaces of the substrates. Specifically, a substrate having a hydrophilic or hydrophobic front surface can be satisfactorily dried while the collapse of a pattern is prevented by using the above substrate processing.

This invention can be applied to substrate processing techniques in general for processing a substrate formed with a pattern on a front surface.

Although the invention has been described by way of the specific embodiments above, this description is not intended to be interpreted in a limited sense. By referring to the description of the invention, various modifications of the disclosed embodiments will become apparent to a person skilled in this art similarly to other embodiments of the invention. Hence, appended claims are thought to include these modifications and embodiments without departing from the true scope of the invention.

What is claimed is:

1. A substrate processing method, comprising:
    a liquid film formation step of forming a liquid film of a processing liquid, in which cyclohexanone oxime is dissolved in a solvent, on a front surface of a substrate formed with a pattern by supplying the processing liquid to the front surface of the substrate;
    a solidified film formation step of forming a solidified film of the cyclohexanone oxime by solidifying the liquid film of the processing liquid; and
    a sublimation step of removing the solidified film from the front surface of the substrate by sublimating the solidified film.

2. The substrate processing method according to claim 1, wherein:
    a concentration of the cyclohexanone oxime contained in the processing liquid is lower than a solubility of the cyclohexanone oxime in the solvent.

3. The substrate processing method according to claim 2, wherein:
    the concentration of the cyclohexanone oxime contained in the processing liquid is 0.1% by volume or more and 10% by volume or less.

4. The substrate processing method according to claim 1, wherein:
    in the liquid film formation step, the substrate is rotated about an axis of rotation parallel to a surface normal to the front surface of the substrate and a rotation speed of the substrate is 300 rpm or more and 3000 rpm or less.

5. The substrate processing method according to claim 4, wherein:
    the concentration of the cyclohexanone oxime contained in the processing liquid is set to be relatively higher as the rotation speed of the substrate is set higher.

6. The substrate processing method according to claim 4, wherein:
the solidified film formation step includes a step of filling the cyclohexanone oxime into the pattern by rotating the substrate about the axis of rotation at a rotation speed lower than the rotation speed of the substrate in the liquid film formation step.

7. The substrate processing method according to claim 6, wherein:
in the solidified film formation step, solidification of the liquid film is promoted by increasing the rotation speed of the substrate after the cyclohexanone oxime is filled into the pattern.

8. The substrate processing method according to claim 6, wherein:
in the solidified film formation step, solidification of the liquid film is promoted by discharging an inert gas to the substrate after the cyclohexanone oxime is filled into the pattern.

9. The substrate processing method according to claim 1, wherein:
the pattern is formed by a front-end process, and
an aspect ratio of the pattern is 35 or less.

10. The substrate processing method according to claim 1, wherein:
the pattern is formed by a back-end process, and
an aspect ratio of the pattern is 7 or less.

11. The substrate processing method according to claim 1, wherein:
the front surface of the substrate is hydrophilic or hydrophobic.

12. The substrate processing method according to claim 1, wherein:
the solvent is a liquid containing at least one type selected from a group composed of pure water, deionized water, aliphatic hydrocarbon, aromatic hydrocarbon, ester, alcohols, ketones, cycloalkanes and ethers.

13. A substrate processing apparatus, comprising:
a solvent storage that stores a solvent;
a processing liquid storage that stores a processing liquid in which cyclohexanone oxime is dissolved in the same solvent as the solvent; and
a processing liquid supply unit that supplies the concentration-adjusted processing liquid obtained by diluting the processing liquid with the solvent supplied from the solvent storage to a front surface of a substrate formed with a pattern.

14. The substrate processing apparatus according to claim 13, wherein:
the processing liquid supply unit includes a mixing member, a first piping connecting the mixing member and the processing liquid storage and a second piping connecting the mixing member and the solvent storage, and feeds the concentration-adjusted processing liquid obtained by diluting the processing liquid supplied via the first piping with the solvent supplied via the second piping in the mixing member to the front surface of the substrate.

15. The substrate processing apparatus according to claim 13, comprising a third piping connecting the solvent storage and the processing liquid storage,
wherein the processing liquid supply unit supplies the solvent to the processing liquid storage via the third piping and supplies the diluted concentration-adjusted processing liquid to the front surface of the substrate.

* * * * *